(12) United States Patent
More et al.

(10) Patent No.: US 11,404,561 B2
(45) Date of Patent: Aug. 2, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Shahaji B. More, Hsinchu (TW); Shih-Chieh Chang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 24 days.

(21) Appl. No.: 16/984,093

(22) Filed: Aug. 3, 2020

(65) Prior Publication Data

US 2022/0037507 A1    Feb. 3, 2022

(51) Int. Cl.
| | |
|---|---|
| *H01L 29/66* | (2006.01) |
| *H01L 29/78* | (2006.01) |
| *H01L 21/8234* | (2006.01) |
| *H01L 29/417* | (2006.01) |

(52) U.S. Cl.
CPC .. *H01L 29/6681* (2013.01); *H01L 21/823431* (2013.01); *H01L 29/41791* (2013.01); *H01L 29/785* (2013.01)

(58) Field of Classification Search
CPC ......... H01L 29/6681; H01L 21/823431; H01L 29/41791; H01L 29/785; H01L 2924/13067; H01L 21/823821; H01L 21/845; H01L 27/10879; H01L 29/66795–66818; H01L 2029/7858; H01L 29/086; H01L 29/0878; H01L 29/78618–78627; H01L 2029/7863; H01L 21/823418; H01L 29/41783; H01L 21/823814; H01L 29/66636; H01L 29/66696; H01L 29/66727; H01L 29/41766; H01L 29/0865–0869; H01L 29/0882–0886; H01L 29/41758; H01L 27/11553; H01L 27/1158; H01L 29/0847; H01L 29/1033

See application file for complete search history.

(56) References Cited

U.S. PATENT DOCUMENTS

| | | | |
|---|---|---|---|
| 2017/0084741 A1* | 3/2017 | Lin | ................ H01L 29/495 |
| 2019/0123201 A1* | 4/2019 | Li | ................ H01L 21/0228 |
| 2020/0105606 A1* | 4/2020 | Lin | ............ H01L 21/823431 |
| 2020/0168735 A1* | 5/2020 | Yu | ............... H01L 29/66795 |

* cited by examiner

*Primary Examiner* — Cuong B Nguyen
(74) *Attorney, Agent, or Firm* — McDermott Will & Emery LLP

(57) ABSTRACT

Semiconductor device manufacturing includes forming fins over substrate extending in first direction. Gate is formed over fin's first portion, gate extends in second direction crossing first. Fin mask layer formed on fin sidewalls. Fin second portions are recessed, wherein second portions are located on opposing gate sides. Epitaxial source/drains are formed over recessed fins. Epitaxial source/drain structures include first layer having first dopant concentration, second layer having second dopant concentration, and third layer having third dopant concentration. Third concentration is greater than second concentration, second concentration is greater than first concentration. At least adjacent third layers source/drains merge thereby form merged source/drains, and height in third direction substantially perpendicular to first and second directions from upper surface of adjacent fins to merged source/drain lower surface uppermost point is greater than thickness of merged source/drain in third direction from lower surface uppermost point of source/drain to source/drain top surface.

20 Claims, 23 Drawing Sheets

SEMICONDUCTOR DEVICE AND MANUFACTURING METHOD THEREOF

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
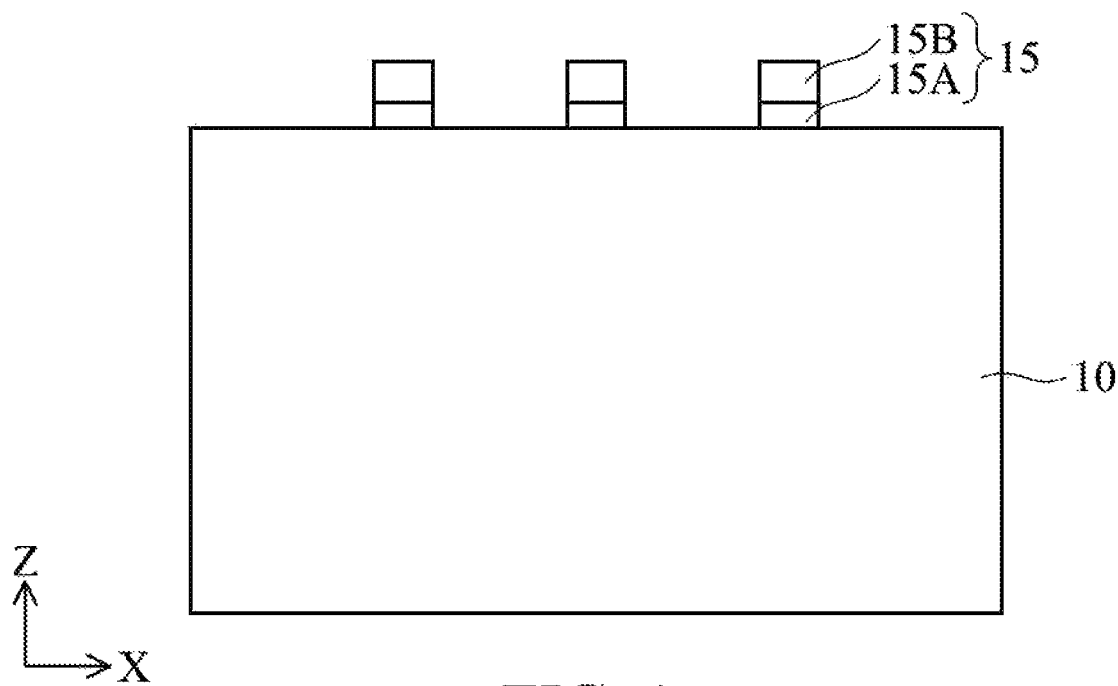
FIG. 1 shows one of the various stages of a sequential manufacturing operation of a semiconductor device according to an embodiment of the disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

As semiconductor devices shrink and semiconductor operating requirements increase, it is desirable to reduce device electrical resistance. The present disclosure provides semiconductor devices with source/drains having reduced electrical resistance. The reduced electrical resistance of the semiconductor devices according to embodiments of the disclosure provide improved semiconductor performance.

FIGS. 1-15 show exemplary cross sectional views of various stages for manufacturing semiconductor devices according to one embodiment of the present disclosure. It is understood that additional operations can be provided before, during, and after processes shown by FIGS. 1-15, and some of the operations described below can be replaced or eliminated, for additional embodiments of the method. The order of the operations/processes may be interchangeable.

A hard mask layer 15 is formed over a substrate 10. The hard mask layer 15 is formed by, for example, a thermal oxidation process, and/or a chemical vapor deposition (CVD) process. The substrate 10 is, for example, a p-type silicon or germanium substrate with an impurity concentration in a range from about $1 \times 10^{15}$ cm$^{-3}$ to about $1 \times 10^{16}$ cm$^{-3}$. In other embodiments, the substrate is an n-type silicon or germanium substrate with an impurity concentration in a range from about $1 \times 10^{15}$ cm$^{-3}$ to about $1 \times 10^{16}$ cm$^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The hard mask layer 15 includes, for example, a pad oxide (e.g., silicon oxide) layer 15A and a silicon nitride mask layer 15B in some embodiments.

The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

By using the mask pattern as an etching mask, a patterned hard mask layer 15 of the pad oxide layer and the silicon nitride mask layer is formed, as shown in FIG. 1.

Figure 2:
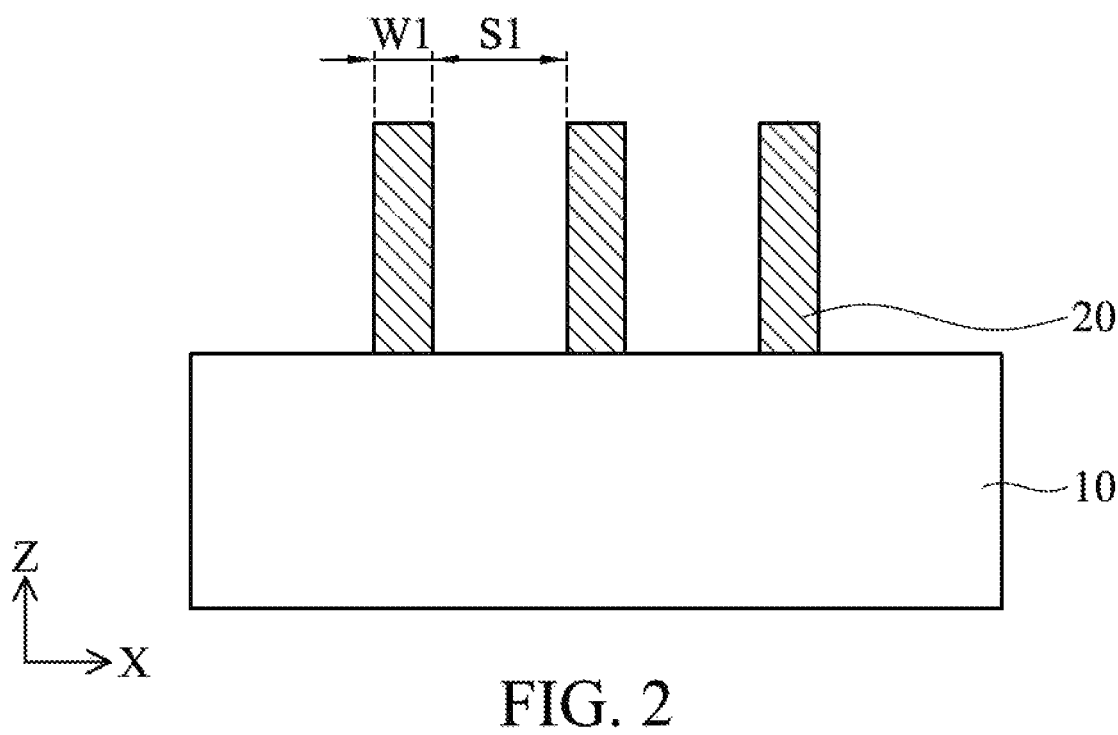
FIG. 2 shows one of the various stages of a sequential manufacturing operation of a semiconductor device according to an embodiment of the disclosure.

Then, as shown in FIG. 2, by using the patterned hard mask layer 15 as an etching mask, the substrate 10 is patterned into fin structures 20 by trench etching using a dry etching method and/or a wet etching method.

The fin structures 20 may be patterned by any suitable method. For example, the fin structures 20 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 20.

In FIG. 2, three fin structures 20 are disposed over the substrate 10. However, the number of the fin structures is not limited to three. The numbers may be as small as one or more than three. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 3 nm to about 40 nm in some embodiments, and is in a range from about 7 nm to about 12 nm in other embodiments. The space Si between two fin structures is in a range from about 10 nm to about 50 nm in some embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIG. 5A) may be referred to as a well region, and the upper part of the fin structure 20 may be referred to as a channel region. Under the gate structure 40, the well region is embedded in the isolation insulating layer 30 (see, FIG. 5A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Figure 3:
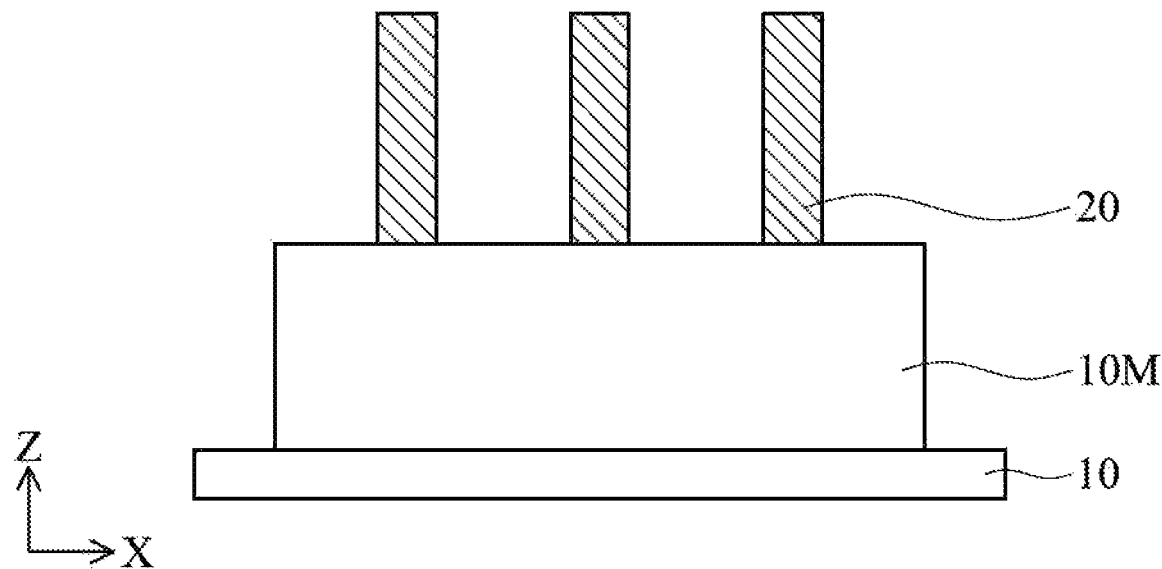
FIG. 3 shows one of the various stages of a sequential manufacturing operation of a semiconductor device according to an embodiment of the disclosure.

After the fin structures 20 are formed, the substrate 10 is further etched to form a mesa shape 10M, as shown in FIG. 3 in some embodiments. In other embodiments, the mesa shape 10M is first formed, and then the fin structures 20 are formed.

After the fin structures 20 and the mesa shape 10M are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorus.

Figure 4:
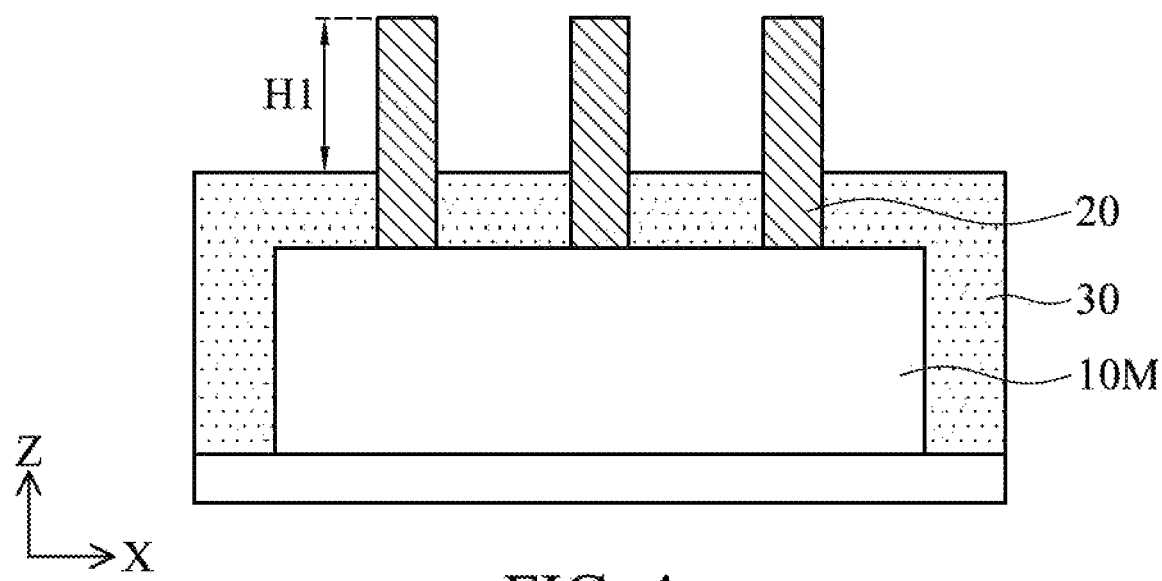
FIG. 4 shows one of the various stages of a sequential manufacturing operation of a semiconductor device according to an embodiment of the disclosure.

The isolation insulating layer 30 is first formed in a thick layer so that the fin structures are embedded in the thick layer, and the thick layer is recessed so as to expose the upper portions of the fin structures 20, as shown in FIG. 4. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar, or He ambient.

Figure 5A:
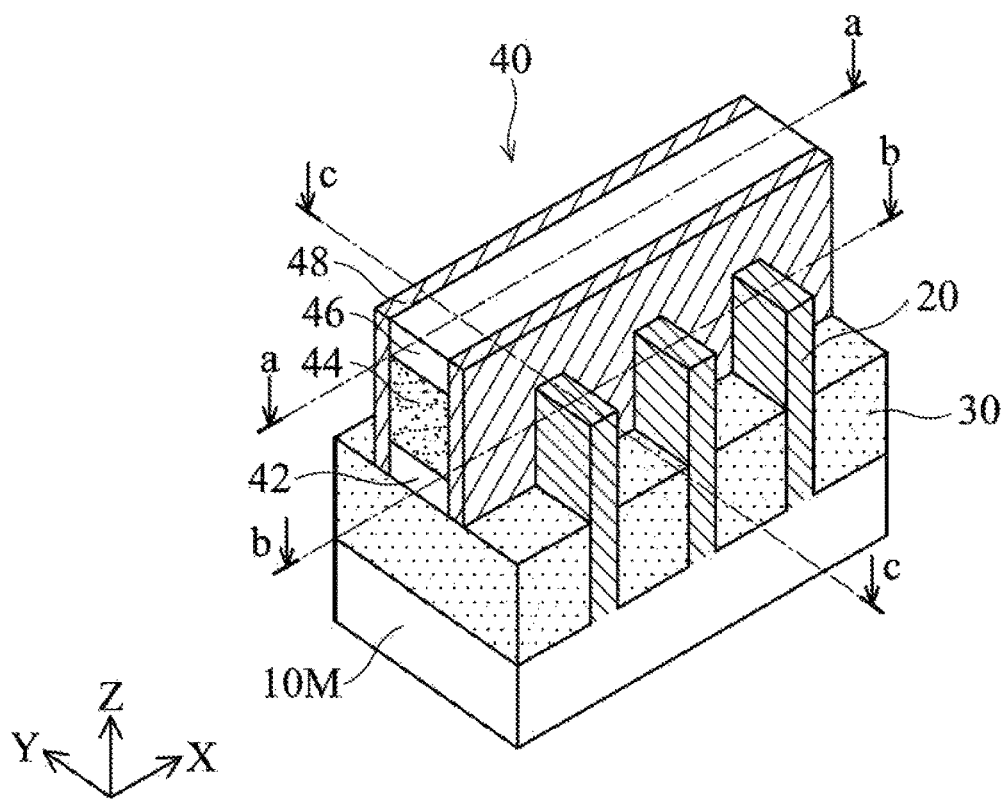
FIGS. 5A, 5B, and 5C show one of the various stages of a sequential manufacturing operation of a semiconductor device according to an embodiment of the disclosure.
Figure 5B:
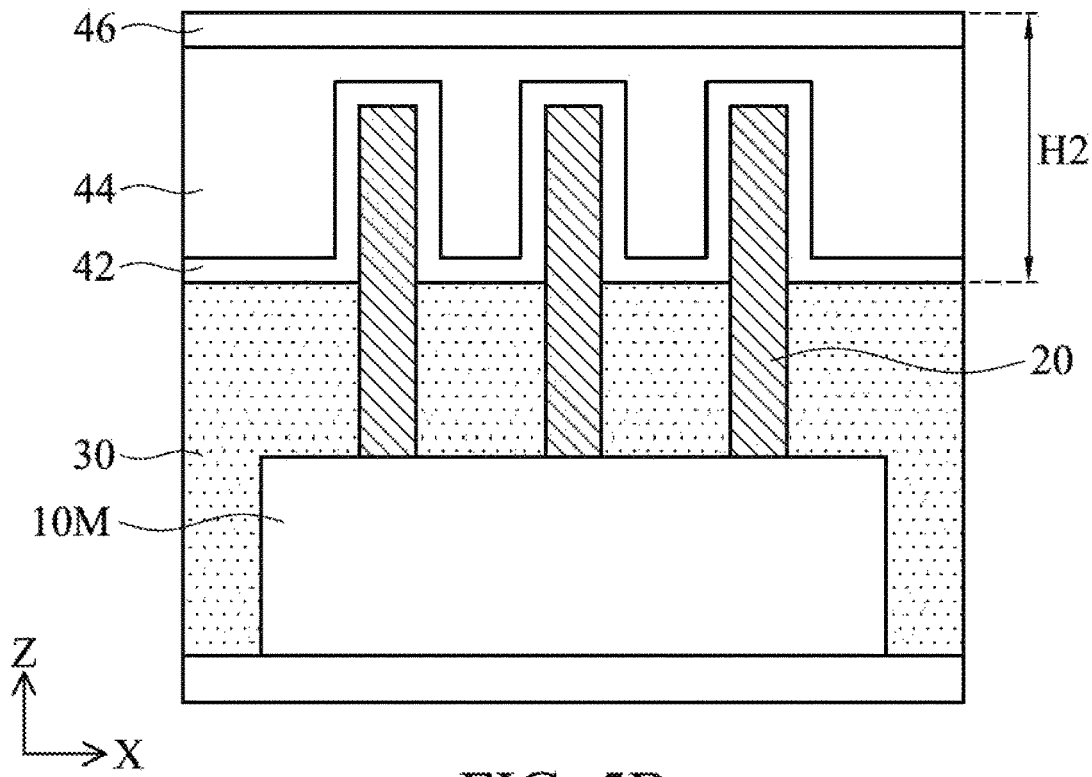
Figure 5C:
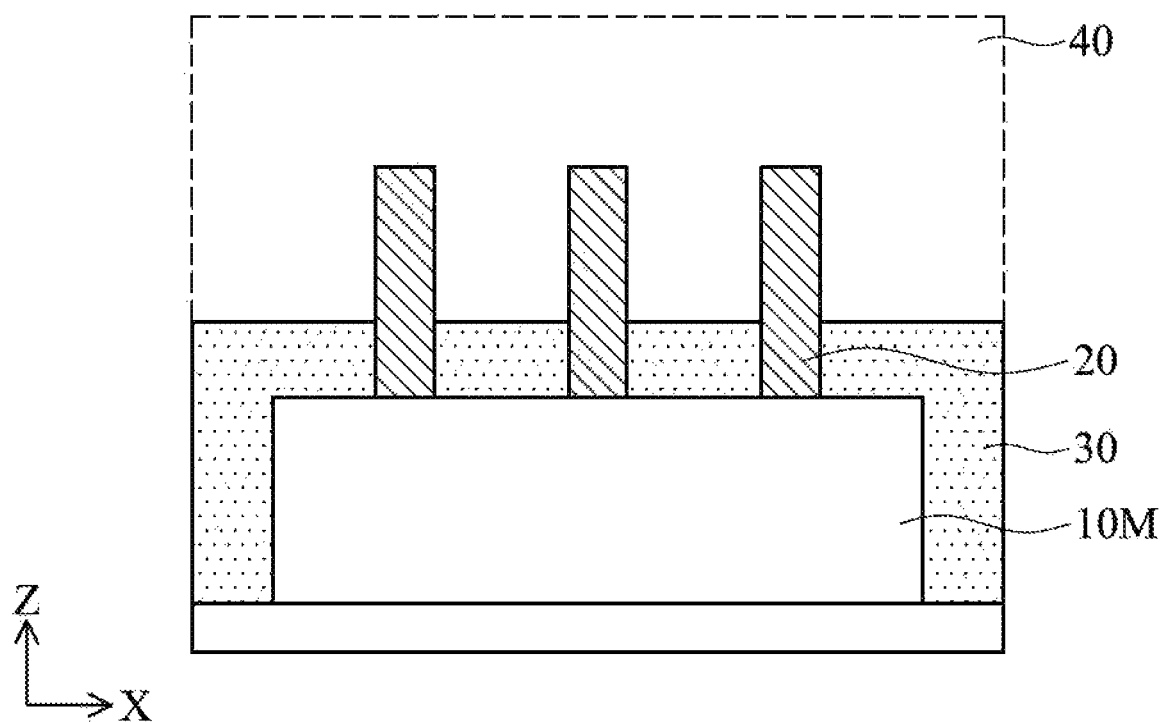

After the isolation insulating layer 30 is formed, a gate structure 40 is formed over the fin structures 20, as shown in FIGS. 5A-5C. FIG. 5A is an exemplary perspective view, FIG. 5B is an exemplary cross sectional view along line a-a of FIG. 5A and FIG. 5C is an exemplary cross sectional view along line b-b of FIG. 5A. FIGS. 6-14 are also exemplary cross sectional views along line b-b of FIG. 5A.

As shown in FIG. 5A, the gate structure 40 extends in the X direction, while the fin structures 20 extend in the Y direction. In some embodiments, the gate structure 40 is a sacrificial (or dummy) gate structure.

To fabricate the gate structure 40, a dielectric layer and a polysilicon layer are formed over the isolation insulating layer 30 and the exposed fin structures 20, and then patterning operations are performed so as to obtain gate structures including a gate pattern 44 made of polysilicon and a dielectric layer 42. In some embodiments, the polysilicon layer is patterned by using a hard mask and the hard mask remains on the gate pattern 44 as a cap insulating layer 46. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process. In some embodiments, the dielectric layer 42 may include one or more layers of silicon oxide, silicon nitride, silicon oxynitride, or high-k dielectrics. In some embodiments, a thickness of the dielectric layer 42 is in a range from about 2 nm to about 20 nm, and in a range from about 2 nm to about 10 nm in other embodiments. The height H2 of the gate structures is in a range from about 50 nm to about 400 nm in some embodiments, and is in a range from about 100 nm to 200 nm in other embodiments.

In some embodiments, a gate replacement technology is employed. In such a case, the gate pattern 44 and the dielectric layer 42 are a sacrificial gate electrode and a sacrificial gate dielectric layer, respectively, which are subsequently removed. If a gate-first technology is employed, the gate pattern 44 and the dielectric layer 42 are used as a gate electrode and a gate dielectric layer.

Further, gate sidewall spacers 48 are formed on both sidewalls of the gate pattern. The sidewall spacers 48 include one or more layers of insulating material, such as $SiO_2$, $Si_3N_4$, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material and performing anisotropic etching. In one embodiment, the sidewall spacer layers are made of silicon nitride based material, such as $Si_3N_4$, SiON, SiOCN or SiCN.

Figure 6:
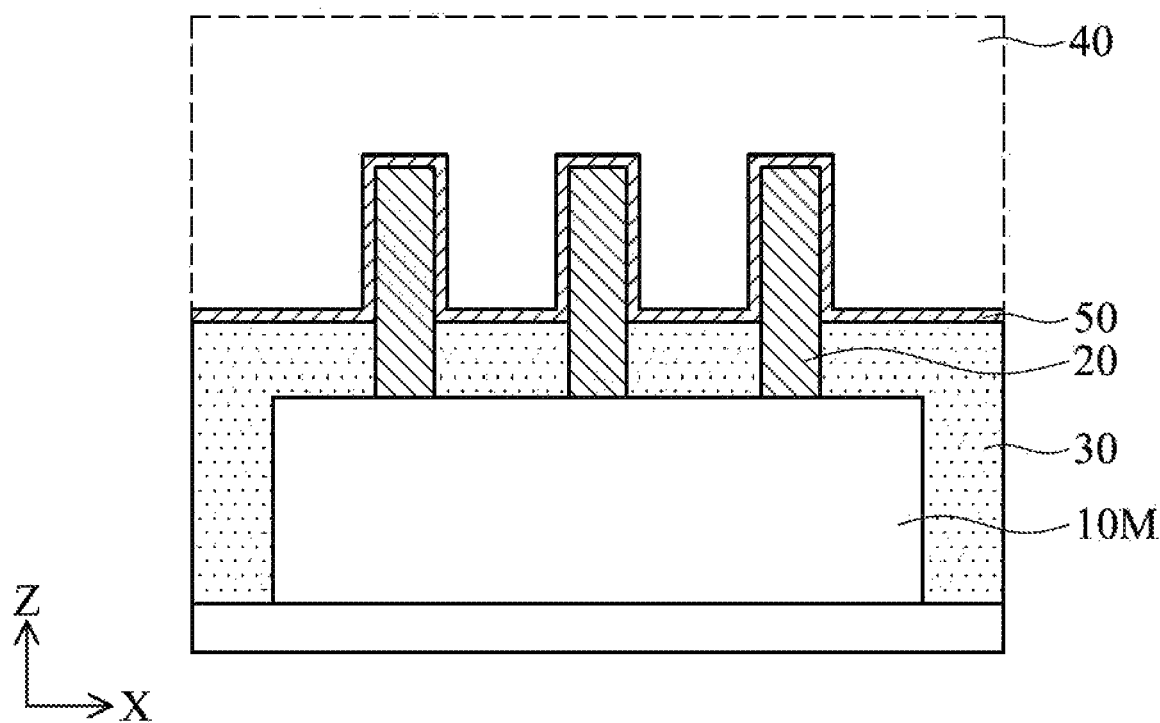
FIG. 6 shows one of the various stages of a sequential manufacturing operation of a semiconductor device according to an embodiment of the disclosure.

Then, as shown in FIG. 6, a fin mask layer 50 is formed over the fin structures 20. The fin mask layer 50 is made of dielectric material including silicon nitride based material, such as $Si_3N_4$, SiON, SiOCN or SiCN. In one embodiment, $Si_3N_4$ is used as the fin mask layer 50. The fin mask layer 50 is formed by CVD, PVD, ALD, e-beam evaporation, or other suitable process. The thickness of the fin mask layer 50 is in a range from about 3 nm to about 10 nm in some embodiments.

In some embodiments, the fin mask layer 50 and the sidewall spacers 48 for the gate structure are separately formed. In other embodiments, the same blanket layer is used for the fin mask layer 50 and the sidewall spacers 48.

Figure 7:
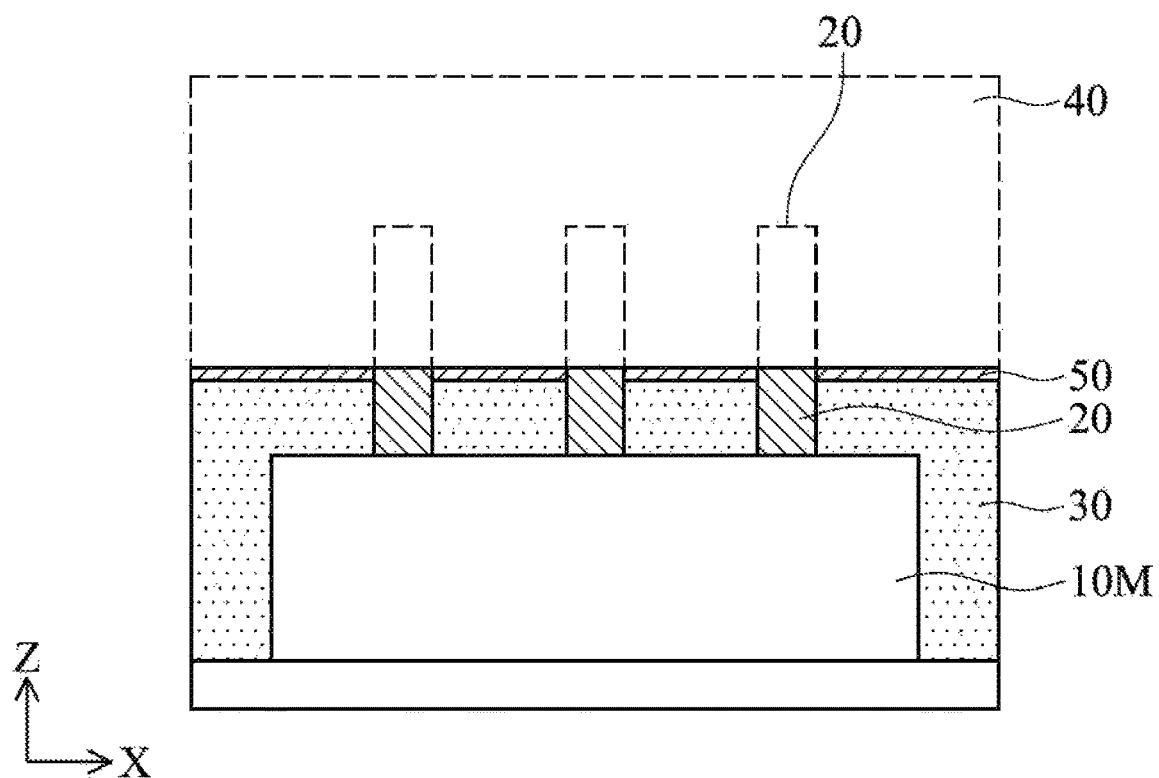
FIG. 7 shows one of the various stages of a sequential manufacturing operation of a semiconductor device according to an embodiment of the disclosure.

After forming the fin mask layer 50, the upper portion of the fin structures 20 are recessed and a part of the fin mask layer 50 disposed on side surfaces and the top surface of the fin structures protruding from the isolation insulating layer are removed by a dry etching and/or a wet etching operation. The upper portion of the fin structures 20 are recessed (etched) down to the level equal to or below the upper surface of the fin mask layer 50 on the upper surface isolation insulating layer 30, as shown in FIG. 7. By adjusting etching conditions, for example, an over-etching time, the fin mask layer 50 remains on the upper surface of the isolation insulating layer 30. The thickness of the remaining fin mask layer 50 is in a range from about 2 nm to about 5 nm in some embodiments.

Figure 8:
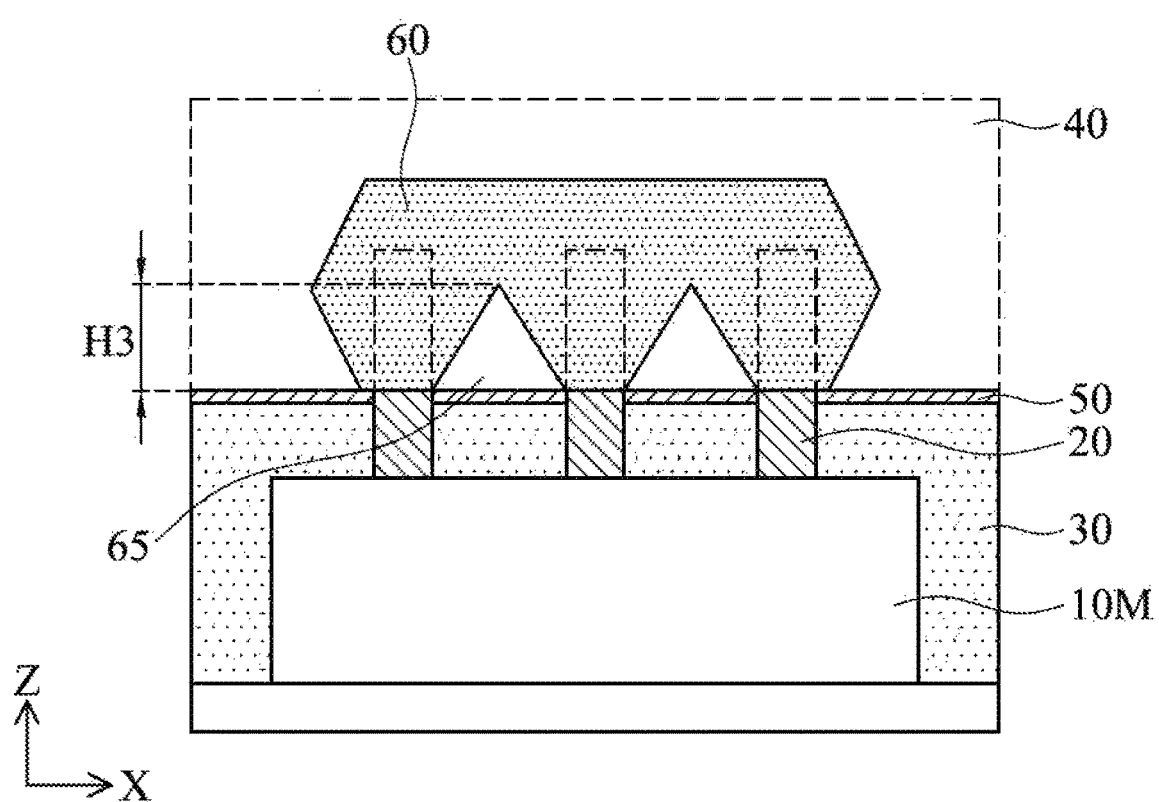
FIG. 8 shows one of the various stages of a sequential manufacturing operation of a semiconductor device according to an embodiment of the disclosure.

Then, as shown in FIG. 8, an epitaxial source/drain structure 60 is formed over the recessed fin structures 20. The epitaxial source/drain structure 60 is made of one or more layers of semiconductor material having a different lattice constant than the fin structures 20 (channel regions). When the fin structures are made of Si, the epitaxial source/drain structure 60 includes SiP, SiC, SiCP, SiP:As, SiP:Ge, SiP:GeAs, or combination thereof for an n-channel Fin FET and SiGe:B or Ge:B for a p-channel Fin FET. The epitaxial source/drain structure 60 is epitaxially formed over the upper portions of the recessed fin structures. Due to the crystal orientation of the substrate formed into the fin structures 20 (e.g., (100) plane), the epitaxial source/drain structure 60 grows laterally and have a diamond-like shape in some embodiments.

Due to the relatively small space between the fin structures and the fin mask layer 50 remaining on the upper surface of the isolation insulating layer between the fin structures, the adjacent epitaxial source/drain structures formed over each of the first fin structures 20 are merged such that a void or a gap (an air gap) 65 is formed by the second epitaxial source/drain structure 60 and the fin mask layer 50 on the upper surface of the isolation insulating layer 30, as shown in FIG. 8.

In particular, due to the fin mask layer 50 on the upper surface of the isolation insulating layer 30, the height H3 of the void 65 is larger than the case where no fin mask layer 50 remains on the upper surface of the isolation insulating layer 30. In some embodiments, the height H3 of the void is in a range from about 10 nm to about 30 nm measured from the upper surface of fin mask layer 50, and in a range from about 15 nm to about 25 nm in other embodiments. In addition, due to the remaining fin mask layer 50, the isolation insulating layer 30 is protected during the fin etching.

Figure 9A:
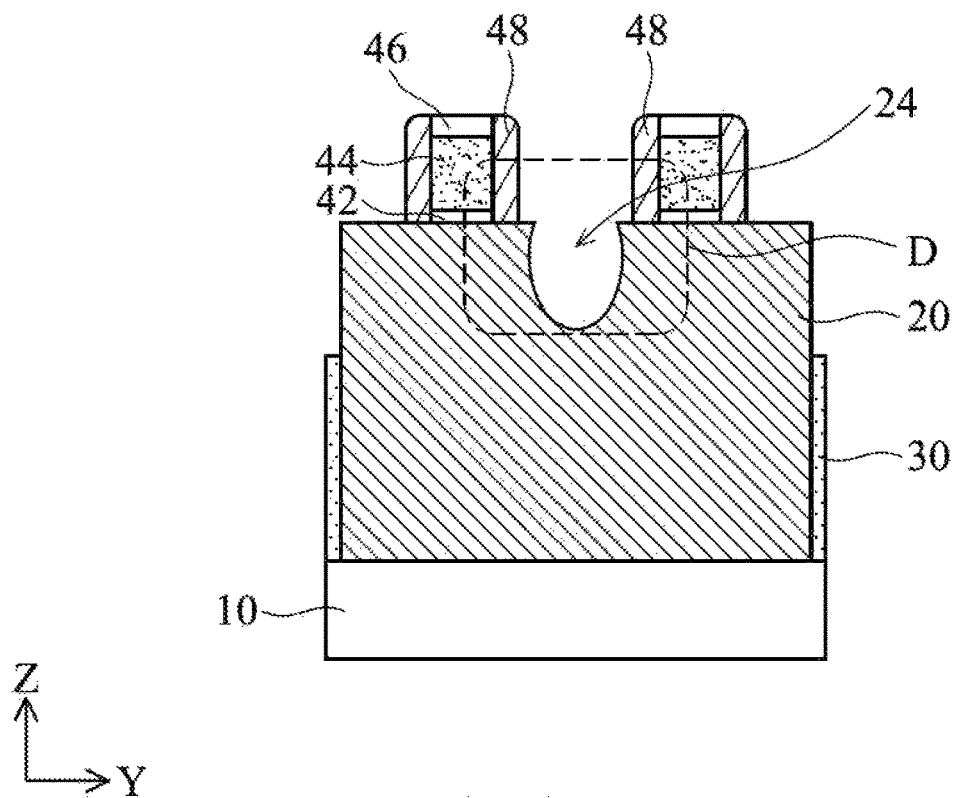
FIGS. 9A, 9B, 9C, 9D, 9E, 9F, 9G, 9H, 9I, 9J, 9K, and 9L show various stages of a sequential manufacturing operation of a semiconductor device according to an embodiment of the disclosure.
Figure 9B:
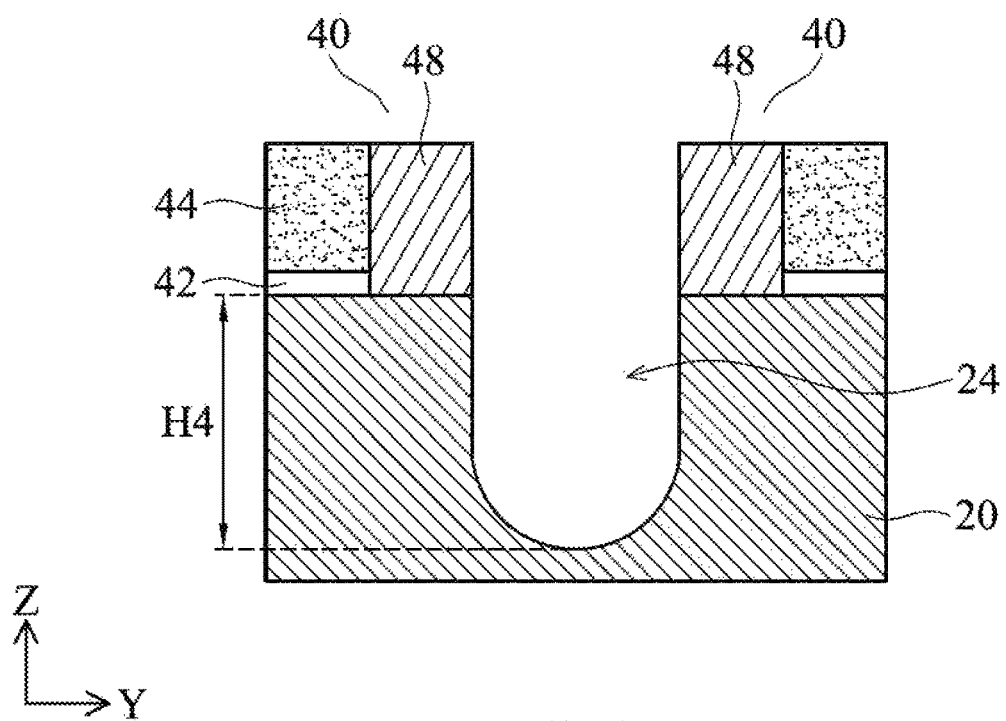

In some embodiments, the source/drain structures 60 include a plurality of layers having different dopant concentrations. FIGS. 9A-9L show detailed cross-sectional views of various stages of a sequential manufacturing operation of the source/drain regions 60 according to an embodiment of the disclosure. FIG. 9B is an enlarged view of a source/drain region D of FIG. 9A. As shown in FIGS. 9A and 9B, the cross sectional shape in the Z-Y plane (corresponding to line c-c of FIG. 5A) of a source/drain recess 24 has a rounded shape in some embodiments. In some embodiments, the source/drain recess 24 is a U-shape cross section having substantially vertical side walls and a rounded bottom. A depth H4 of the source/drain recess 24 is in a range from about 30 nm to about 100 nm in some embodiments, and is in a range from about 40 nm to about 60 nm in other embodiments. Two fin structures 20 are shown in FIGS. 9D, 9F, 9I, and 9K. However, semiconductor devices according to the present disclosure include one fin structure or three or more fin structures in some embodiments. Two gate structures 40 are shown in FIGS. 9A, 9B, 9C, 9E, 9G, 9H, and 9J. However, semiconductor devices according to the present disclosure include one gate structure or three or more gate structures in some embodiments.

Figure 9C:
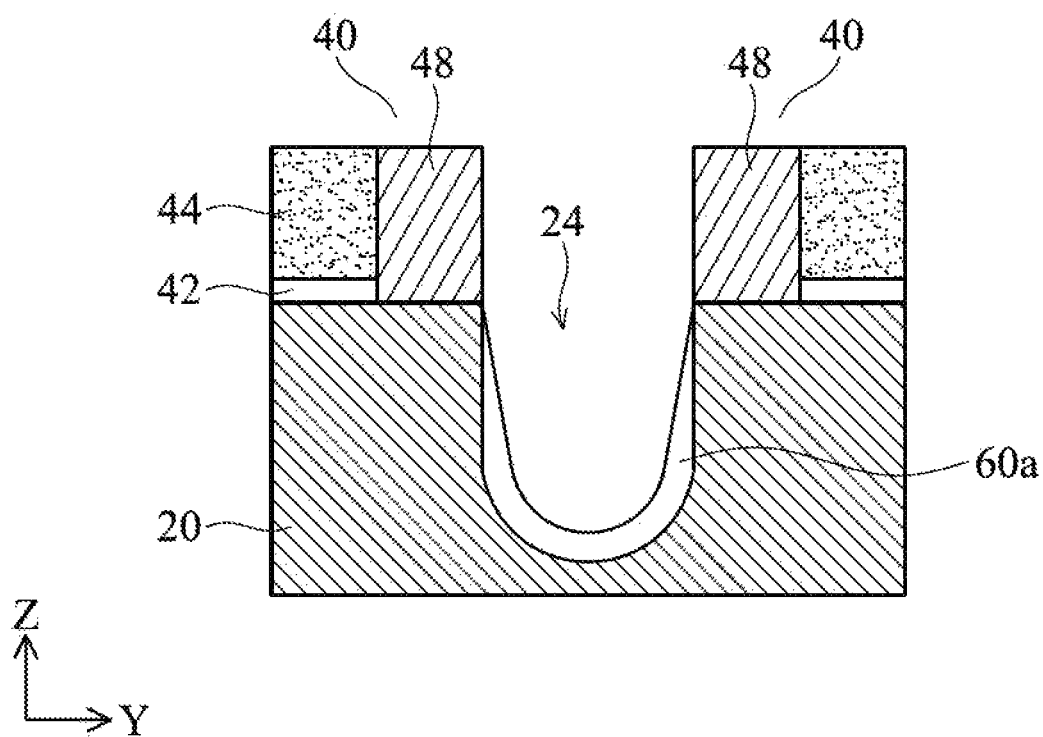
Figure 9D:
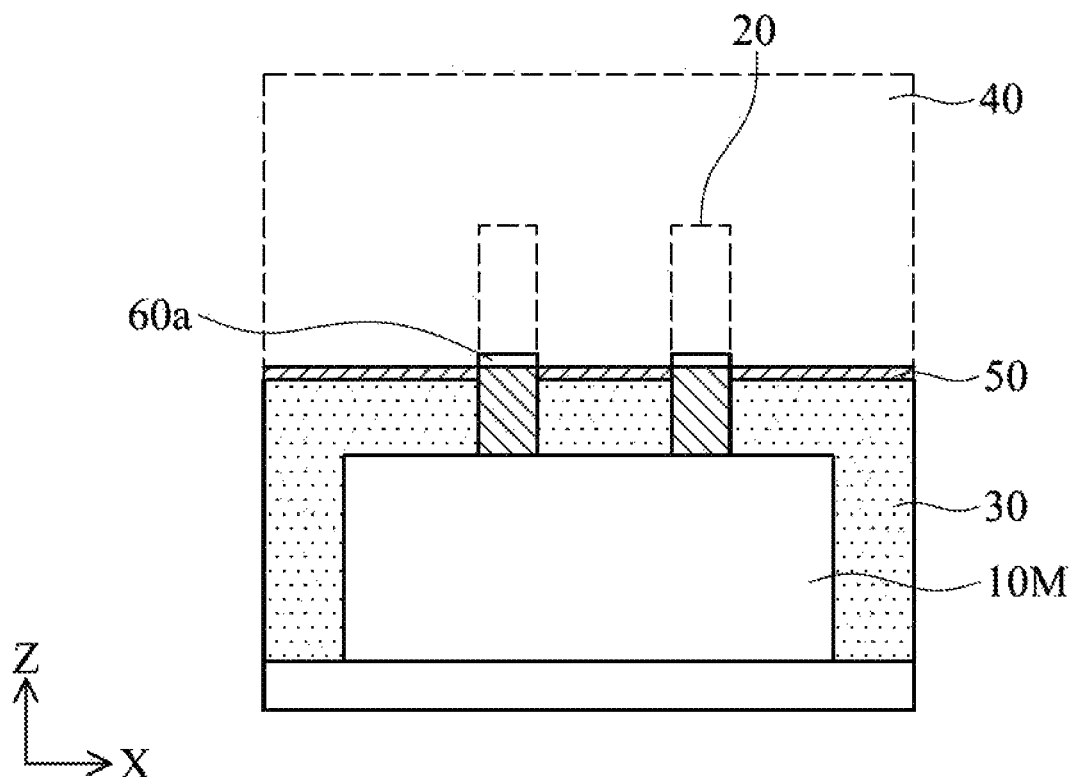

After the source/drain recess 24 is formed, a first source/drain epitaxial layer 60a is formed in the source/drain recess 24, as shown in FIGS. 9C and 9D. FIG. 9C is an enlarged view of the source/drain region corresponding to line c-c of FIG. 5A (Z-Y plane). FIG. 9D is a cross section corresponding to line b-b of FIG. 5A (Z-X plane). In some embodiments, the first source/drain epitaxial layer 60a functions as a protective layer for the subsequently formed higher dopant concentration source/drain epitaxial layers. The first source/drain epitaxial layer 60a prevents the subsequently formed higher dopant concentration source/drain epitaxial layers from touching the fin structure 20 sidewalls. In some embodiments, the source/drain epitaxial layers grow faster along the (100) crystal direction than the (110) and (111) crystal directions depending on the epitaxial layer deposition conditions and materials. As shown in FIG. 9C, the thinner (111) facet of the first source/drain epitaxial layer 60a is exposed just below the gate sidewall spacers 48, and the thicker (100) facet of the first source/drain epitaxial layer 60a is exposed at the bottom of the recess 24.

Figure 9E:
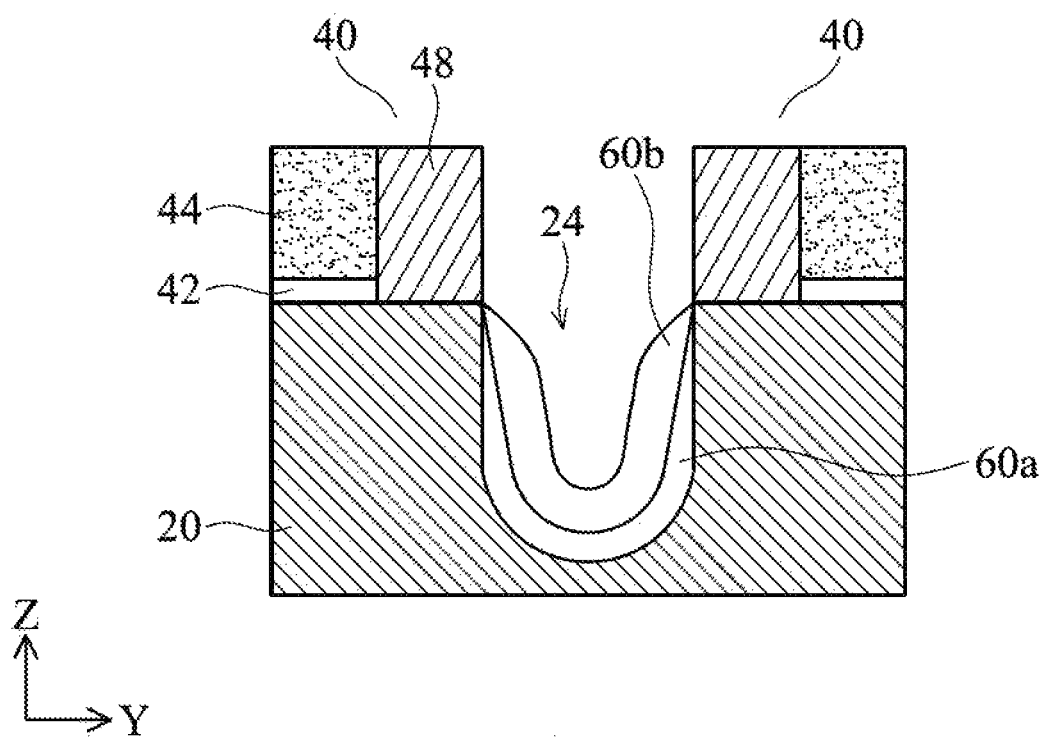
Figure 9F:
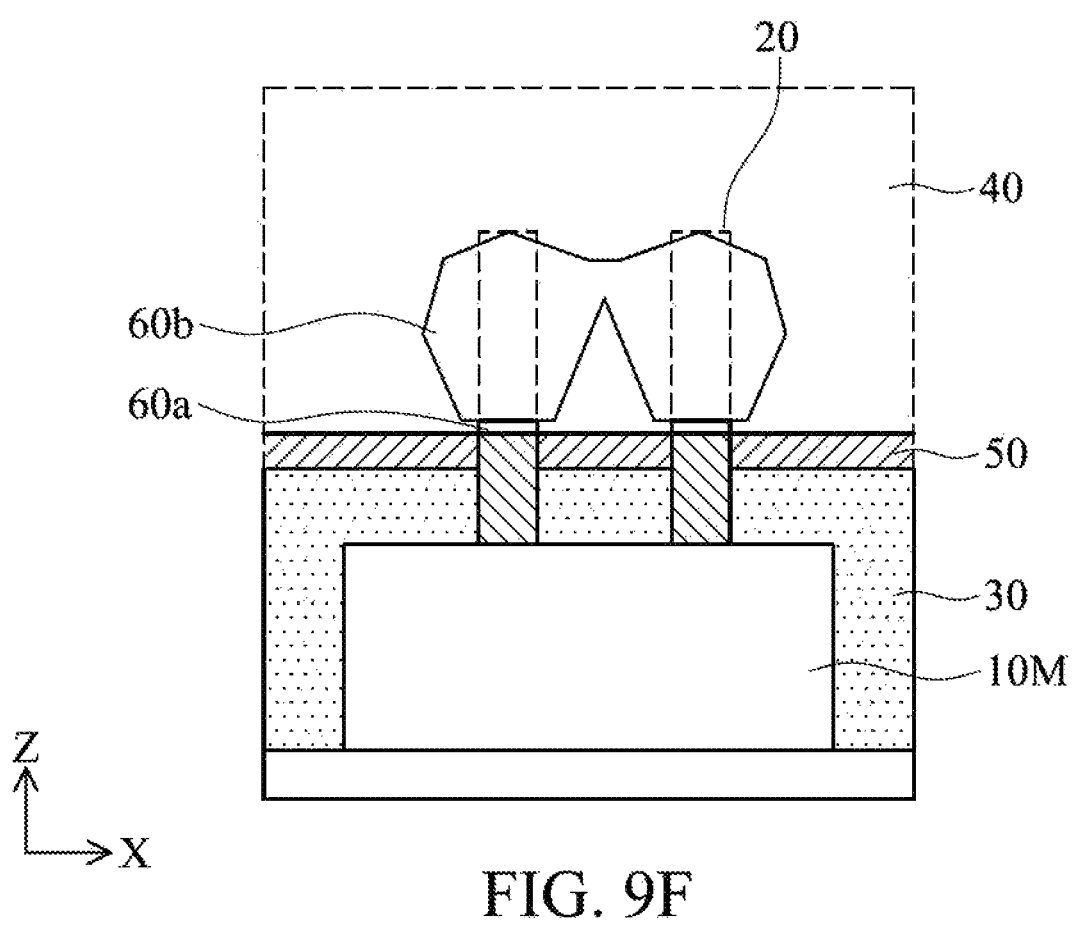

After the first source/drain epitaxial layer 60a is formed, a second source/drain epitaxial layer 60b is formed over the first source/drain epitaxial layer 60a, as shown in FIGS. 9E and 9F. FIG. 9E is an enlarged view of the source/drain region corresponding to line c-c of FIG. 5A (Z-Y plane). FIG. 9F is a cross section view corresponding to line b-b of FIG. 5A (Z-X plane). As shown in FIG. 9F, the second source/drain epitaxial layers 60b on adjacent fin structures 20 are grown so that they merge in some embodiments. In other embodiments, the second source/drain epitaxial layers 60b on adjacent fin structures almost merge (not quite touching). In some embodiments, the second source/drain epitaxial layers 60b are etched back after epitaxial deposition to obtain a desired shape of the second source/drain epitaxial layers 60b. For example, in some embodiments, a HCl-based etchant, which preferentially etches along the (110) and (111) directions rather than the (100) direction, is used. In some embodiments, $SiH_4$ is introduced during the etching operation to provide the desired surface profile of second source/drain epitaxial layer 60b. In some embodiments, a diamond shape second source/drain epitaxial layer 60b is formed. In some embodiments, the second source/drain epitaxial layer 60b has a wave-shaped upper surface.

Figure 9G:
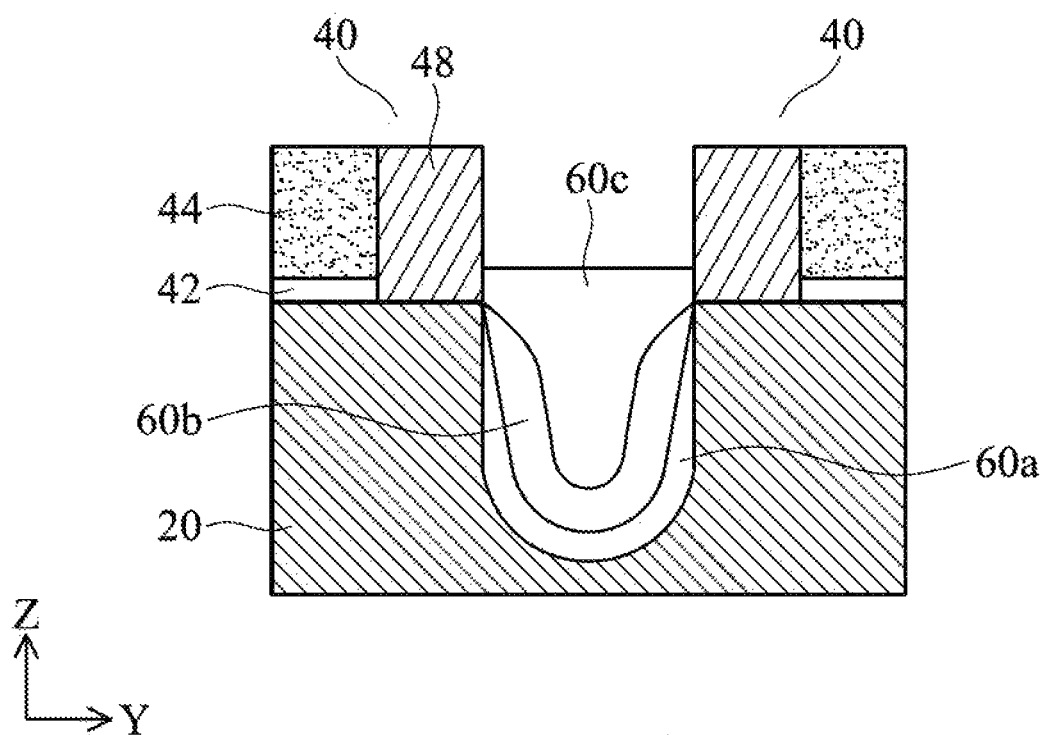
Figure 9H:
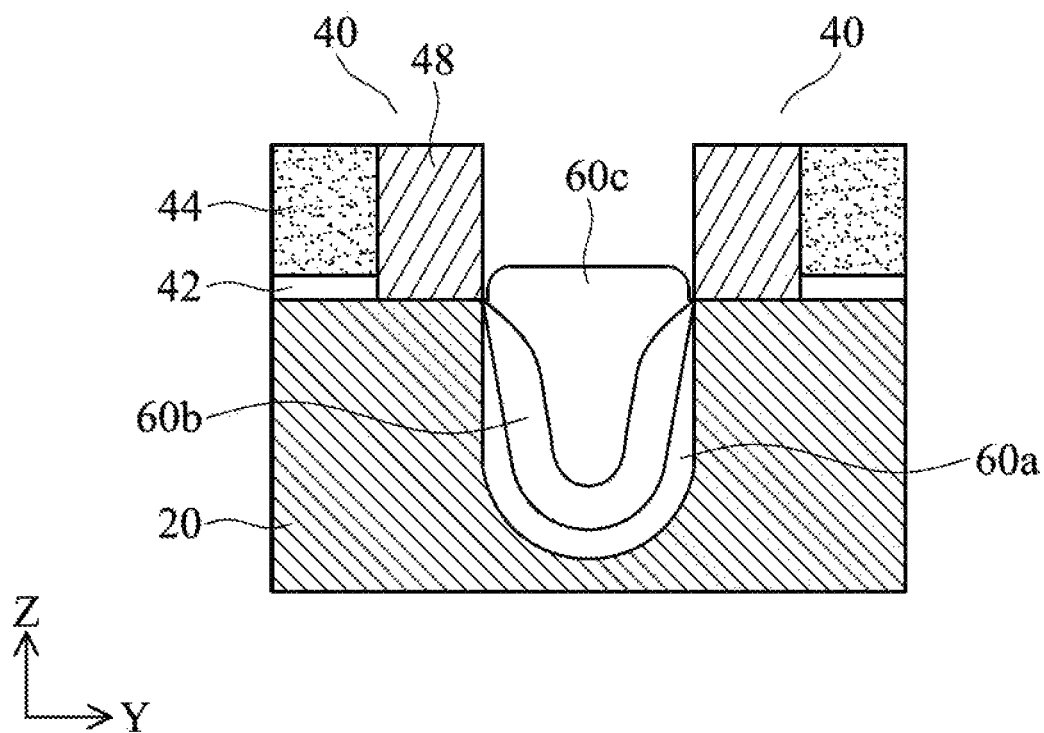
Figure 9I:
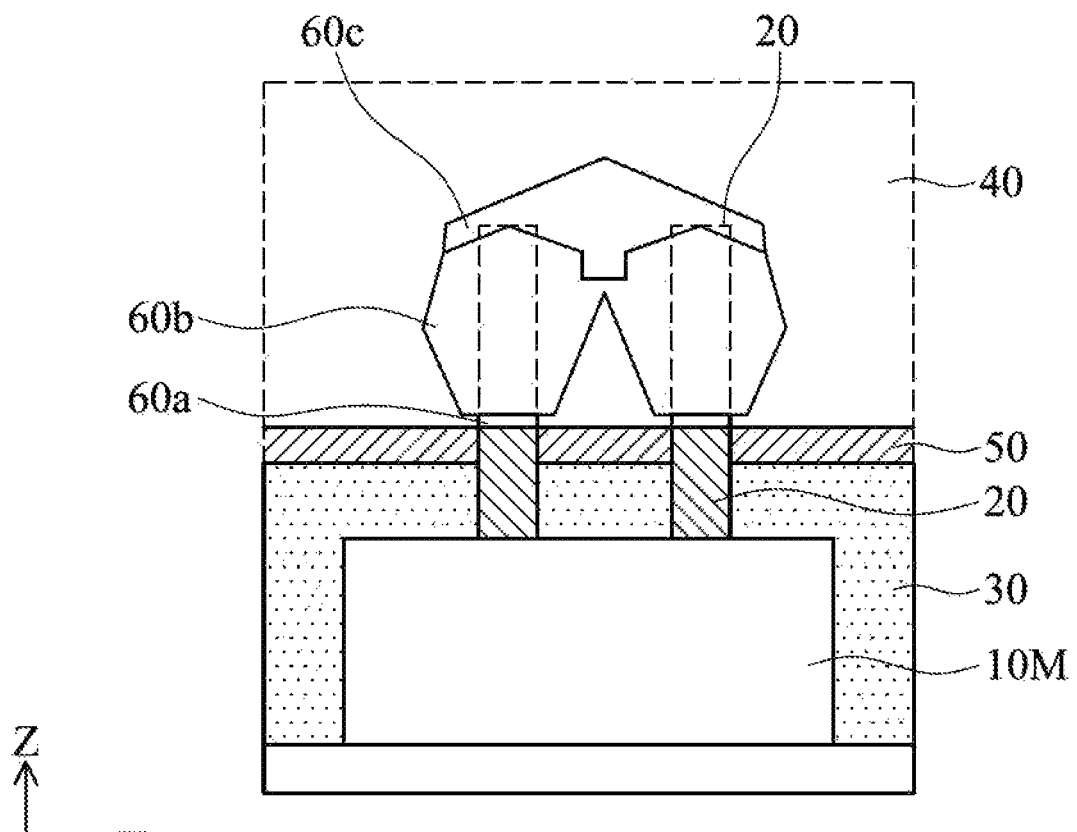

After the second source/drain epitaxial layer 60b is formed, a third source/drain epitaxial layer 60c is formed over the second source/drain epitaxial layer 60b, as shown in FIGS. 9G, 9H, and 9I. FIGS. 9G and 9H are enlarged views of the source/drain region corresponding to line c-c of FIG. 5A (Z-Y plane). FIG. 9I is a detailed cross section view corresponding to line b-b of FIG. 5A (Z-X plane). The third source/drain epitaxial layer 60c fills the remaining portion of the U-shaped recess and the upper surface of the third source/drain epitaxial layer 60c extends above a top surface of the fin structure 20. In some embodiments, the third source/drain epitaxial layer 60c is mainly deposited in a middle portion of the fin structures 20 and fully covers adjacent fin structures.

In some embodiments, the third source/drain epitaxial layer 60c is deposited in the (100) crystal direction depending on the epitaxial layer deposition conditions and materials. After deposition of the third source/drain epitaxial layer 60c, an $HCl/SiH_4$ etch back operation is performed in some embodiments. The etch back operation etches along the (110) and (111) directions. In some embodiments, the etch back operation produces rounded corners on the third source/drain epitaxial layer 60c, as shown in FIG. 9H. The rounded corners prevent the third source/drain epitaxial layer 60c from touching the gate sidewall spacers 48, the first source/drain epitaxial layer 60a, or the sidewalls of the fin structures 20 in some embodiments. This etch back coupled with the deposition along the (100) direction results in diamond-shaped source/drain regions in some embodiments, as shown in FIG. 9I. In some embodiments, a combination of the etch back operation, and the preferential growth along the (100) crystal direction produces the third source/drain epitaxial layer 60c with a notch between the fin structures, as shown in FIG. 9I.

Figure 9J:
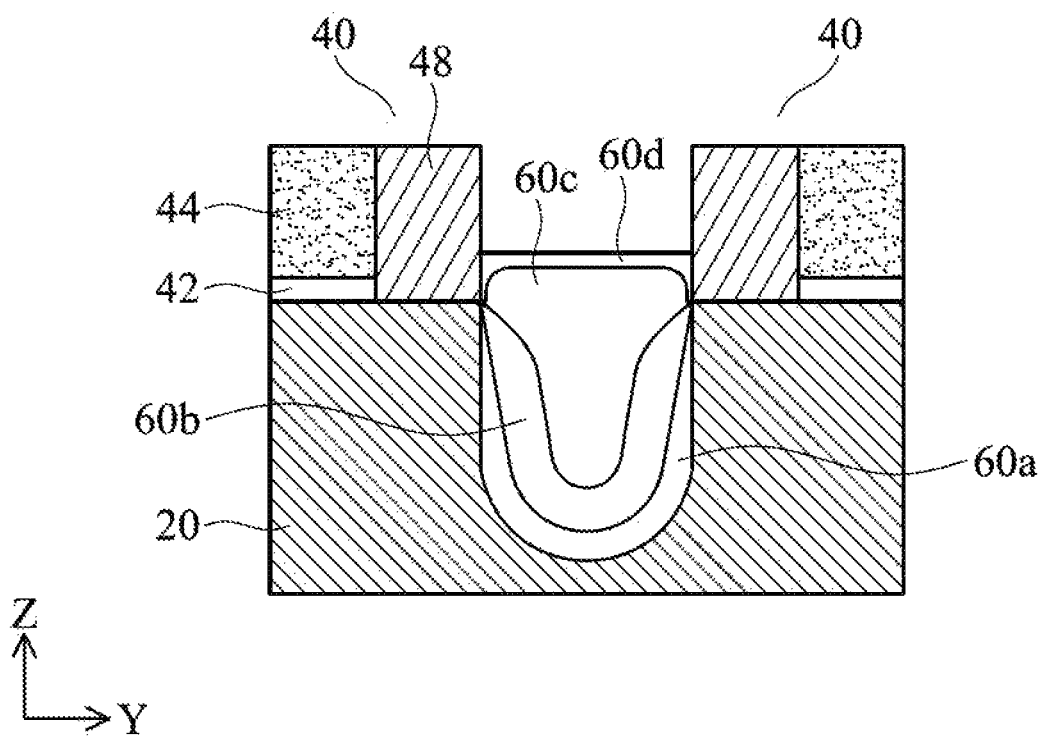
Figure 9K:
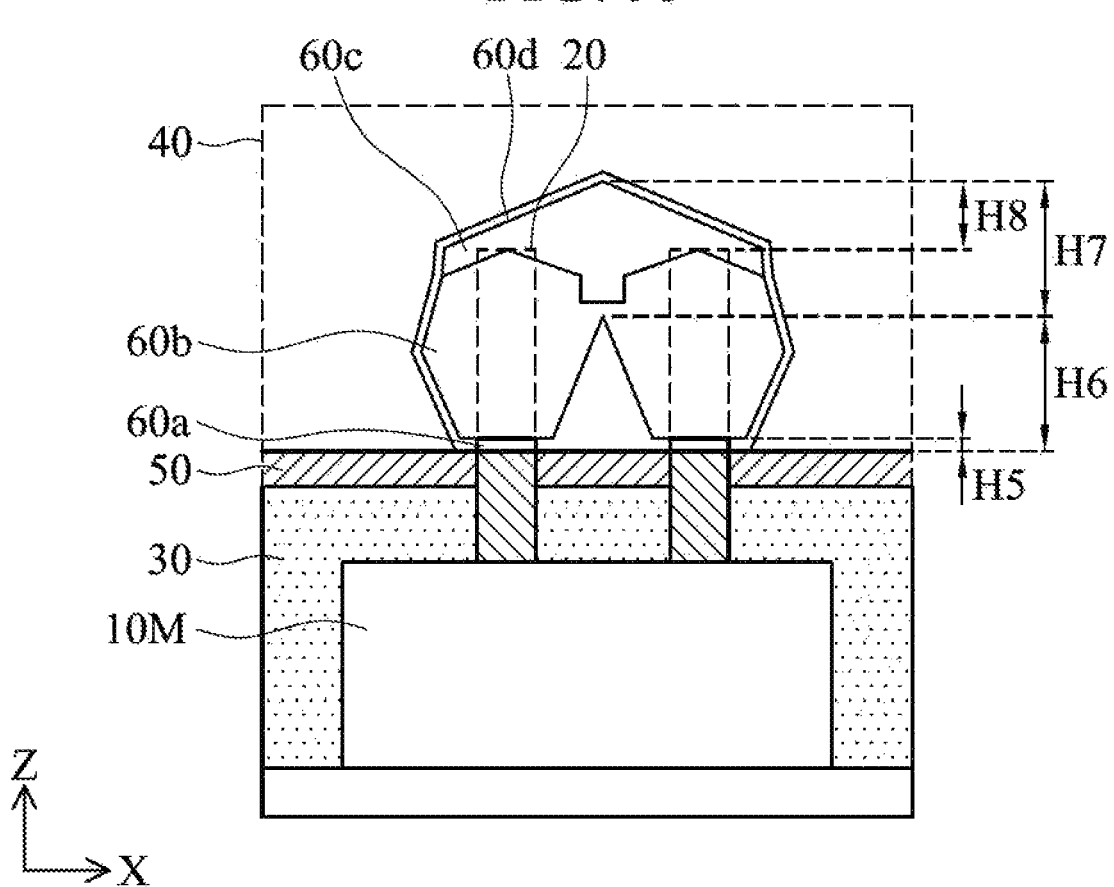
Figure 9L:
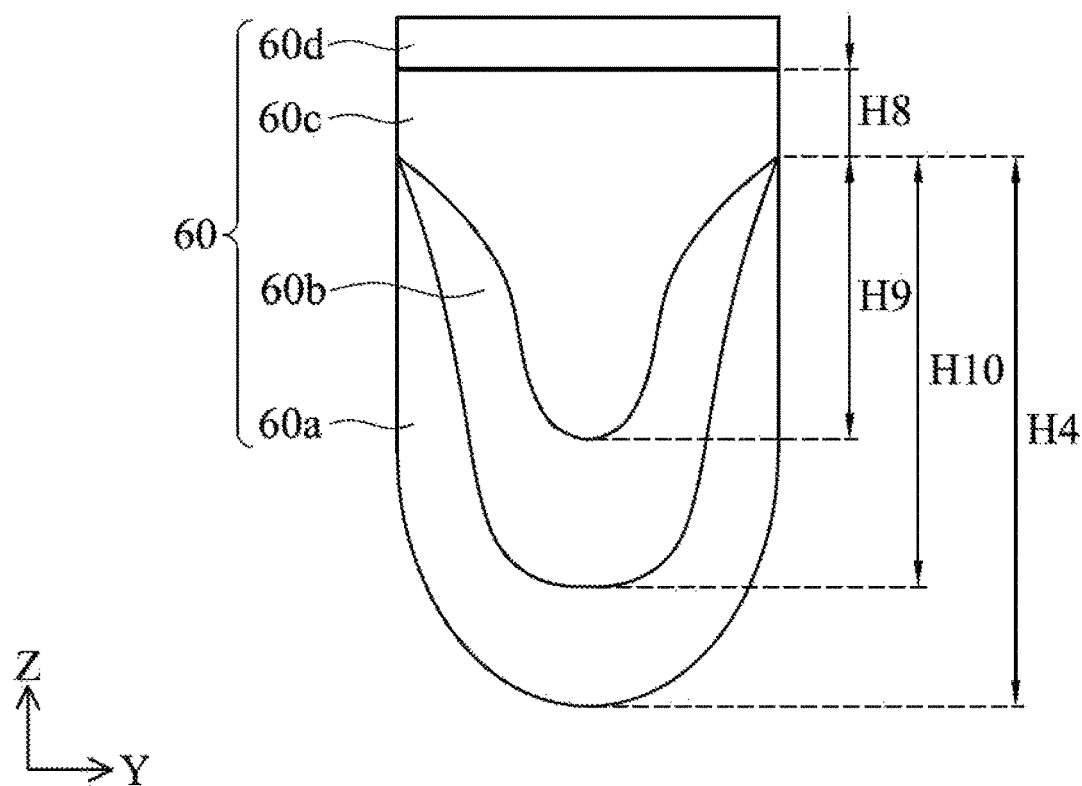

In some embodiments, after the third source/drain epitaxial layer 60c is formed, a fourth source/drain epitaxial layer 60d (or cap layer) is formed over the third source/drain epitaxial layer 60c, as shown in FIGS. 9J, 9K, and 9L. FIG. 9J is an enlarged view of the source/drain region corresponding to line c-c of FIG. 5A (Z-Y plane). FIG. 9K is a detailed cross section view corresponding to line b-b of FIG. 5A (Z-X plane). FIG. 9L is a detailed view of the source/ drain region of FIG. 9I. The fourth source/drain epitaxial layer 60d conformally surrounds the outer surface of the first, second, and third source/drain epitaxial layers 60a, 60b, 60c in some embodiments.

In some embodiments, the epitaxial source/drain structures 60 include a first layer (or first region) 60a having a first concentration of a dopant, a second layer (or second region) 60b having a second concentration of the dopant, and a third layer (or third region) 60c having a third concentration of the dopant. The third concentration is greater than the second concentration, and the second concentration is greater than the first concentration. The concentration of the dopant within the first layer (or the first region) 60a, second layer (or the second region) 60b, third layer (or the third region) 60c, and fourth layer (or the fourth region) 60d is substantially constant within each layer in some embodiments. In some embodiments, the concentration of the dopant varies by less than 20% across the thickness, width, or length of the first layer 60a, second layer 60b, third layer 60c, or fourth layer 60d as viewed in cross section. In some embodiments, the concentration of the dopant varies by less than 10% across the thickness, width, or length of each layer.

The third layers 60c complete the merger of adjacent epitaxial source/drain structures formed over adjacent fin structures or increase the thickness of the merged source/drain structure, as shown in FIGS. 9I and 9K. In some embodiments, a height H6 from a level of upper surfaces of adjacent fin structures 20 in the source/drain regions to an uppermost point of the lower surface of the merged source/drain epitaxial structure 60 is greater than a thickness H7 of the merged source/drain epitaxial structure from the uppermost point of the lower surface of the merged source/drain epitaxial structure 60 to a top surface of the merged third epitaxial layers 60c.

The source/drain epitaxial structure 60 may be grown using a Si-containing gas such as $SiH_4$, $Si_2H_6$, $Si_4H_{10}$, a halogenated silane, such as $SiCl_2H_2$, or an organosilane and/or a Ge containing gas, such as $GeH_4$, $Ge_2H_6$, a halogenated germane, such as $GeCl_2H_2$, or an organogermane, and a dopant gas. A carrier gas is used in the epitaxy operation. In some embodiments, the carrier gas is He, Hz, Nz, or Ar. In some embodiments, the carrier gas is hydrogen.

The gases used during the forming of the epitaxial layers include at least one dopant compound to provide a source of elemental dopant. In some embodiments, the silicon-containing compound is doped with an n-type dopant, such as phosphorus, antimony and/or arsenic. The dopant compounds include arsine ($AsH_3$), phosphine ($PH_3$), and alkylphosphines, such as with the empirical formula $R_xPH_{(3-x)}$, where R=methyl, ethyl, propyl or butyl and x=1, 2, or 3 in some embodiments. Alkylphosphines include trimethylphosphine (($CH_3)_3P$), dimethylphosphine (($CH_3)_2PH$), triethylphosphine (($CH_3CH_2)_3P$), and diethylphosphine (($CH_3CH_2)_2PH$). Alkylarsines include trimethylarsine (($CH_3)_3As$), dimethylarsine (($CH_3)_2AsH$), triethylarsine (($CH_3CH_2)_3As$), and diethylarsine (($CH_3CH_2)_2AsH$).

In some embodiments, the dopant concentration in the third epitaxial layer 60c ranges from $1\times10^{21}$ atoms/cm$^3$ to $5\times10^{21}$ atoms/cm$^3$. In some embodiments, the dopant concentration in the third epitaxial layer ranges from $3\times10^{21}$ atoms/cm$^3$ to $4.5\times10^{21}$ atoms/cm$^3$. In some embodiments, the concentration of the dopant in the second epitaxial layer ranges from $9.0\times10^{20}$ atoms/cm$^3$ to $2\times10^{21}$ atoms/cm$^3$.

The source/drain epitaxial structure 60 may be grown at a temperature of about 500° C. to about 800° C. under a pressure of about 10 mTorr to about 200 Torr. In some embodiments, the source/drain epitaxial layers are grown at a temperature of about 525° C. to about 700° C., and at 550° C. to about 650° C. in other embodiments. In some embodiments, the source/drain epitaxial layers are grown at a pressure of 1 Torr to about 100 Torr, and at about 10 Torr to about 80 Torr in other embodiments. The temperature, pressure, and concentration of the source gases are varied as necessary to form each of the plurality of epitaxial layers having different dopant concentrations.

In some embodiments, the semiconductor device is a N-type FET, and the first, second, and third epitaxial layers are SiP layers. In some embodiments, Ge is implanted into the cap or last epitaxial layer after forming the SiP layers. In some embodiments, the implanted Ge improves the silicide contact by decreasing the contact resistance.

In some embodiments, the thickness H5 of the first epitaxial layer 60a over the fin structure 20 ranges from about 2 nm to about 30 nm, as shown in FIG. 9K, and from about 4 nm to about 15 nm in other embodiments.

In some embodiments, a ratio of a height H6 from the top of the fin to an uppermost point on a bottom surface of the merged source/drain epitaxial structure to the thickness H7 of the merged third layers from the uppermost point on the bottom surface of the merged third layers to a top surface of the merged third layers (H6/H7) ranges from 1.05 to 3.0. Ratios of H6/H7 within this range provide significantly reduced parasitic capacitance and significantly increased device speed. At ratios of H6/H7 less than about 1.05 there is an insufficient improvement in the parasitic capacitance and the device speed. At ratios of H6/H7 greater than about 3.0 the improvement in parasitic capacitance and device speed as the ratio increases becomes negligible. In some embodiments, the ratio H6/H7 ranges from 1.2 to 2.0. In some embodiments, the height H6 from the top of the fin to an uppermost point on a bottom surface of the merged source/drain epitaxial structure ranges from 20.1 nm to 75 nm, and the thickness H7 of the merged source/drain epitaxial structure from the uppermost point on the bottom surface of the merged source/drain epitaxial structure to a top surface of the merged third layers ranges from 20 nm to 25 nm. In some embodiments, the raised height H8 of the third layers above the original top of the fin structures before the recess operation ranges from about 3 nm to about 20 nm. In some embodiments, the raised height H8 is about 7 nm.

In some embodiments, the third layers 60c extend a depth H9 into the second layers 60b from an uppermost surface of the second layers 60b (or the top surface of the fin structure 20) greater than half a height H10 of the second layers as viewed in cross section, as shown in FIG. 9L. In some embodiments, the ratio of the depth H9 from the uppermost surface of the second layers (top surface of fin structure) to the height of the second layers H10 (H9/H10) ranges from about 0.3 to about 0.8, while in other embodiments, the ratio H9/H10 ranges from about 0.4 to about 0.7, and in other embodiments, the ratio H9/H10 ranges from about 0.5 to about 0.6.

In some embodiments, a ratio of the depth H9 that the third layers 60c extend into the recess 24 from a top surface of the fin structure to the depth of the recess 24 H4 (H9/H4) ranges from about 0.2 to about 0.7, while in other embodiments, the ratio H9/H4 ranges from about 0.4 to about 0.6.

In some embodiments, additional dopant is implanted into the third epitaxial layer 60c after forming the third epitaxial layer 60c to increase the amount of dopant in the third epitaxial layer. In some embodiments, phosphorus or a phosphorus dimer is implanted into the third epitaxial layer having different dopant concentrations.

In some embodiments, an annealing operation is performed on the third epitaxial layer 60c. In some embodiments, the annealing operation is performed before forming the fourth epitaxial layer 60d. In some embodiments, the annealing operation includes millisecond annealing, microsecond single step annealing, laser single step annealing, dynamic surface annealing, or microwave annealing. In some embodiments, germanium is implanted into the third epitaxial layers after the annealing operation In some embodiments, the fourth epitaxial layer 60d is a cap layer that inhibits dopant out diffusion from the third epitaxial layer during formation of a subsequently formed metal-semiconductor compound layer, such as a silicide layer over the epitaxial structure. The fourth epitaxial layer 60d improves the formation of the subsequently formed metal-semiconductor compound layer. In some embodiments, the fourth epitaxial layer includes about 3 at. % to about 4 at. % Ge in a SiP layer. In some embodiments, Ge in the fourth epitaxial layer 60d helps maintain the B doping concentration in the underlying third epitaxial layer 60c. In some embodiments, the concentration of P in the fourth epitaxial SiP layer 60d ranges from about $9.0 \times 10^{20}$ atoms/cm$^3$ to $3.8 \times 10^{21}$ atoms/cm$^3$.

In some embodiments, the concentration of dopant in the second epitaxial layer 60b and fourth epitaxial layer is about $3 \times 10^{21}$ atoms/cm$^3$ and the concentration of dopant in the third epitaxial layer is about $4 \times 10^{21}$ atoms/cm$^3$. In some embodiments, the first epitaxial layer 60a is a phosphorus doped silicon layer or a phosphorus and arsenic doped silicon layer. In some embodiments, the concentration of phosphorus in the first epitaxial layer 60a ranges from about $1 \times 10^{20}$ atoms/cm$^3$ to about $5 \times 10^{20}$ atoms/cm$^3$ and in some embodiments, the concentration of arsenic in the first epitaxial layer 60a ranges from about $1 \times 10^{20}$ atoms/cm$^3$ to about $1 \times 10^{21}$ atoms/cm$^3$.

The source/drain structure for an n-channel FET and the source/drain structure for a p-channel FET may be formed by separate epitaxial processes.

In some embodiments, a controller (not shown) is connected to the various controllable components of an epitaxial reactor. The controller is programmed to provide gas flows, temperatures, pressures, etc., to practice the formation of the epitaxial structure as described herein. The controller may include a memory and a microprocessor, and may be programmed by software, hardwired or a combination of the two, and the functionality of the controller may be distributed among processors located in different physical locations.

After the epitaxial source/drain structure 60 is formed, as shown in FIGS. 8-9L, a metal-semiconductor compound layer 70 is formed over the epitaxial source/drain structure 60, as shown in FIGS. 10A-10E. The metal-semiconductor compound layer 70 functions as an electrical contact to the source/drain structure.

A metal material, such as Ni, Ti, Ta, and/or W, is formed over the epitaxial source/drain structure 60, and an annealing operation is performed to form a metal-semiconductor compound layer 70. In some embodiments, the metal-semiconductor compound layer 70 is a metal silicide, such as NiSi, TiSi, TaSi, and/or WSi. In other embodiments, a metal-semiconductor material, such as NiSi, TiSi, TaSi, and/or WSi, is formed over the epitaxial source/drain structure 60, and an annealing operation may be performed. The annealing operation is performed at a temperature of about 250° C. to about 850° C. In some embodiments, the annealing temperature is ramped up from about 250° C. to about 850° C. or less during the annealing operation. The metal material or the silicide material is formed by CVD or ALD. The thickness of the metal-semiconductor compound layer 70 is in a range from about 4 nm to about 10 nm in some embodiments. Before or after the annealing operations, the metal material or the metal-semiconductor compound formed over the isolation insulating layer 30 is selectively removed.

Figure 10A:
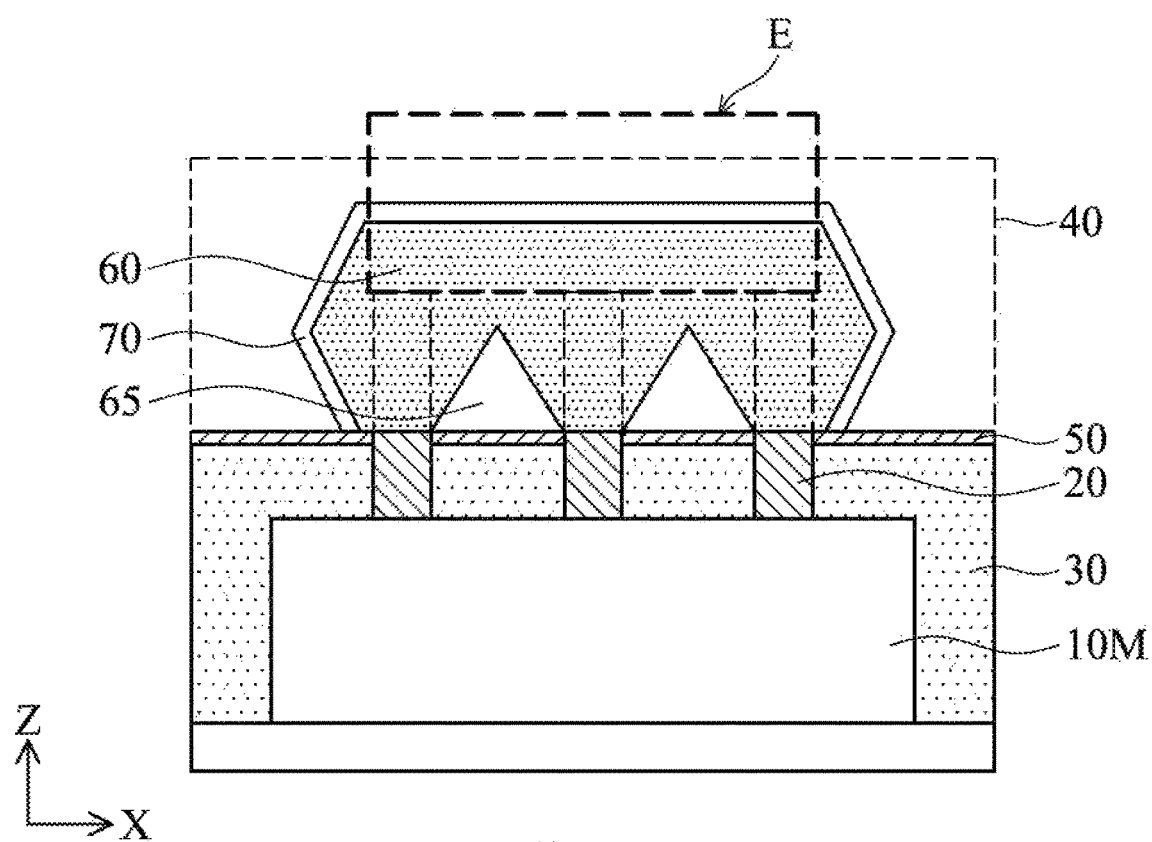
FIG. 10A shows one of the various stages of a sequential manufacturing operation of a semiconductor device according to an embodiment of the disclosure.
Figure 10B:
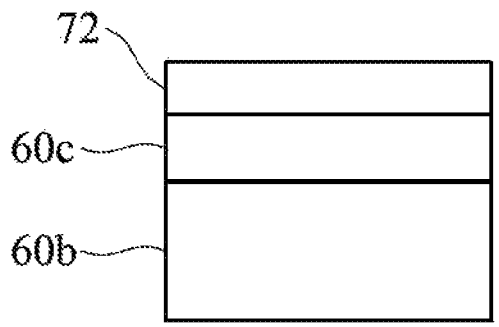
FIGS. 10B, 10C, 10D, and 10E are detailed views showing the formation of a metal-semiconductor compound layer in FIG. 10A.
Figure 10C:
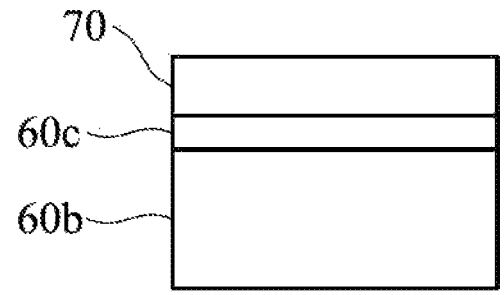

FIGS. 10B-10E are detailed views of portion E in FIG. 10A, showing the formation of the metal-semiconductor compound layer on the source/drain epitaxial structure 60. FIG. 10B shows a metal layer 72 formed over the source/drain epitaxial structure 60 when the uppermost layer of the source/drain epitaxial structure 60 is the third epitaxial layer 60c. In an embodiment, the metal layer 72 is composed of Ti. During the annealing operation the metal layer 72 reacts with an upper portion of the third epitaxial layer 60c to form the metal-semiconductor compound layer 70, as shown in FIG. 10C. In some embodiments, the formation of the metal-semiconductor compound layer consumes most or all of the thickness of the third epitaxial layer 60c. In some embodiments, about 70% to about 80% of the thickness of the third epitaxial layer 60c is consumed by the formation of the metal-semiconductor compound layer. In some embodiments, a portion of the higher dopant concentration third epitaxial layer remains between the metal-semiconductor layer 70 and the lower dopant concentration second epitaxial layer 60b to provide a higher conductivity contact with the metal-semiconductor compound layer 70.

Figure 10D:
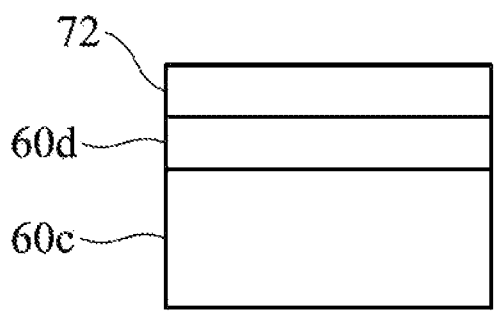
Figure 10E:
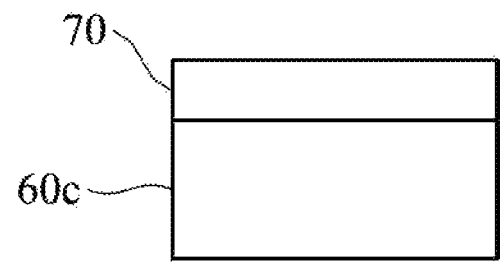

FIG. 10D shows a metal layer formed over the source/drain epitaxial structure 60 when the uppermost layer of the source/drain epitaxial structure 60 is the fourth epitaxial layer 60d. During the annealing operation the metal layer 72 reacts with the fourth epitaxial layer 60d to form the metal-semiconductor compound layer 70, as shown in FIG. 10E. In some embodiments, the entire thickness of fourth epitaxial layer overlying the third epitaxial layer is reacted with the metal layer to form the metal-semiconductor compound layer 70. In some embodiments an upper portion of the third epitaxial layer 60c also reacts with the metal layer. In other embodiments, a portion of the fourth epitaxial layer 60d remains between third epitaxial layer 60c and the metal-semiconductor layer 70 after the annealing operation.

In some embodiments, variation in the dopant concentration in the fourth epitaxial layer 60d affects the shape of the metal-semiconductor compound layer 70. Variations in dopant concentration may produce a wave-shaped metal-semiconductor compound layer 70. To maintain a uniform shape of the metal-semiconductor compound layer 70 in some embodiments, the fourth epitaxial layer 60d is recess etched in the contact region, and then the metal layer 72 is deposited over the source/drain structure and the annealing operation is performed.

In some embodiments where the epitaxial layer includes Si doped with Ge, the metal in the metal layer 72 preferentially reacts with the Si in the epitaxial layer. In some embodiments, the metal-semiconductor compound layer 70 contains less than 1 wt. % metal germanide.

Figure 11:
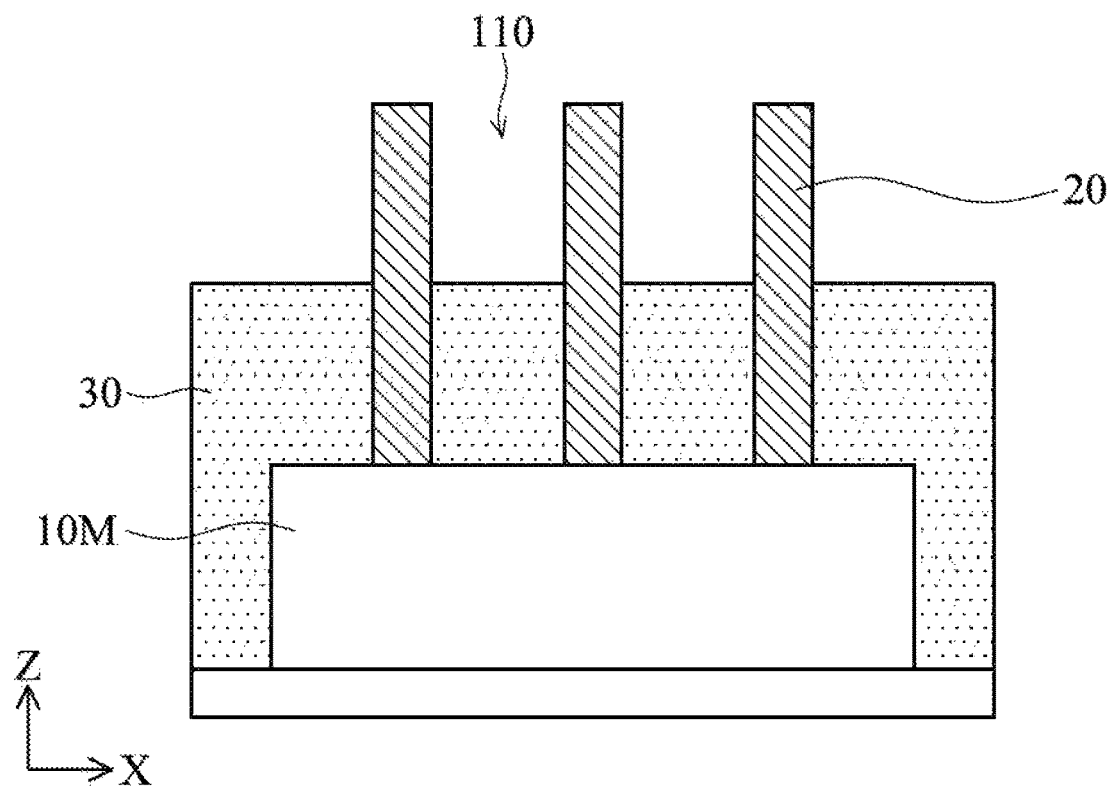
FIG. 11 shows one of the various stages of a sequential manufacturing operation of a semiconductor device according to an embodiment of the disclosure.
Figure 12:
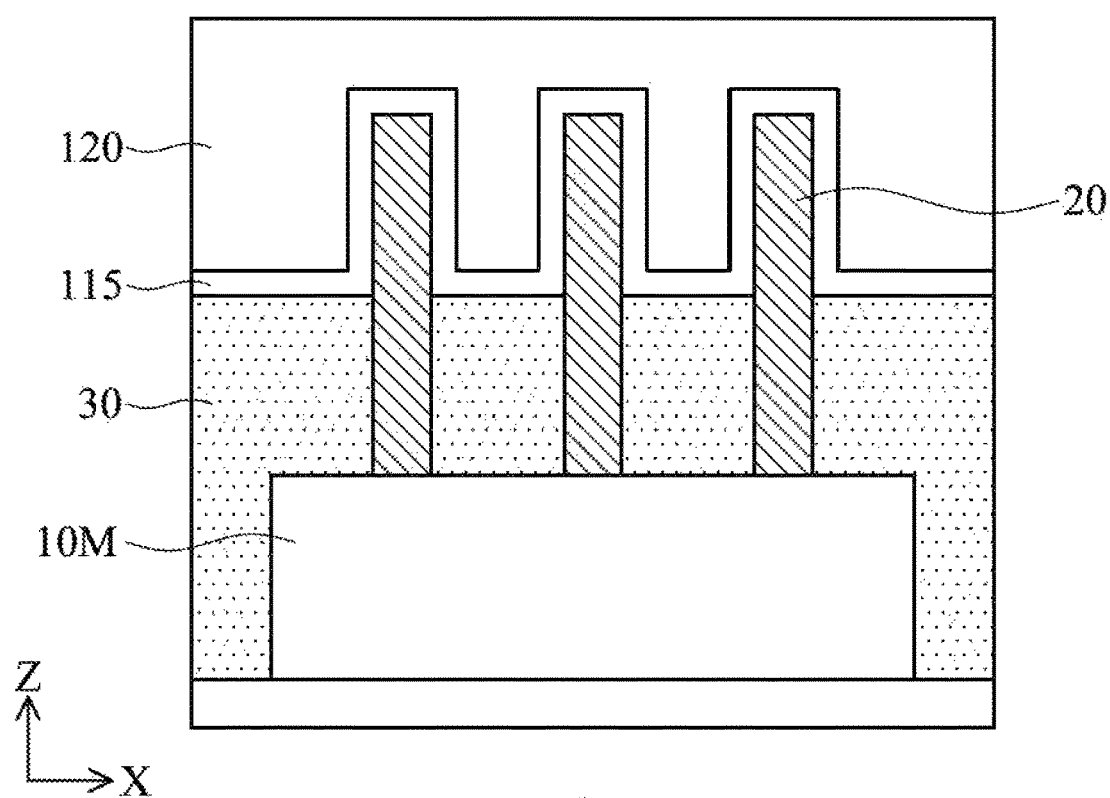
FIG. 12 shows one of the various stages of a sequential manufacturing operation of a semiconductor device according to an embodiment of the disclosure.

Then, a metal gate structure is formed in some embodiments. After forming the metal-semiconductor compound layer 70, the dummy gate structures (sacrificial gate electrode 44 and sacrificial gate dielectric layer 42) are removed by suitable photolithography and etching operations to form a gate space 110, as shown in FIG. 11. Next, a gate dielectric layer 115 is formed over the fin structures and a metal gate electrode 120 is formed over the gate dielectric layer 115.

In certain embodiments, a first interlayer dielectric layer is formed over the sacrificial gate structures and a planarization operation, such as a chemical mechanical polishing (CMP) process or an etch-back process, is performed to expose the upper surface of the sacrificial gate electrode 44. Then, the sacrificial gate electrode 44 and the sacrificial gate dielectric layer 42 are removed, by appropriate etching processes, respectively, to form the gate space 110.

The gate dielectric layer 115 may be formed over an interface layer (not shown) disposed over the channel layer of the fin structures 20. The interface layer may include silicon oxide or germanium oxide with a thickness of 0.2 nm to 1.5 nm in some embodiments. In other embodiments, the thickness of the interface layer is in a range of about 0.5 nm to about 1.0 nm.

The gate dielectric layer 115 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode 120 is formed over the gate dielectric layer. The metal gate electrode includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations, such as CMP, are performed.

Figure 13:
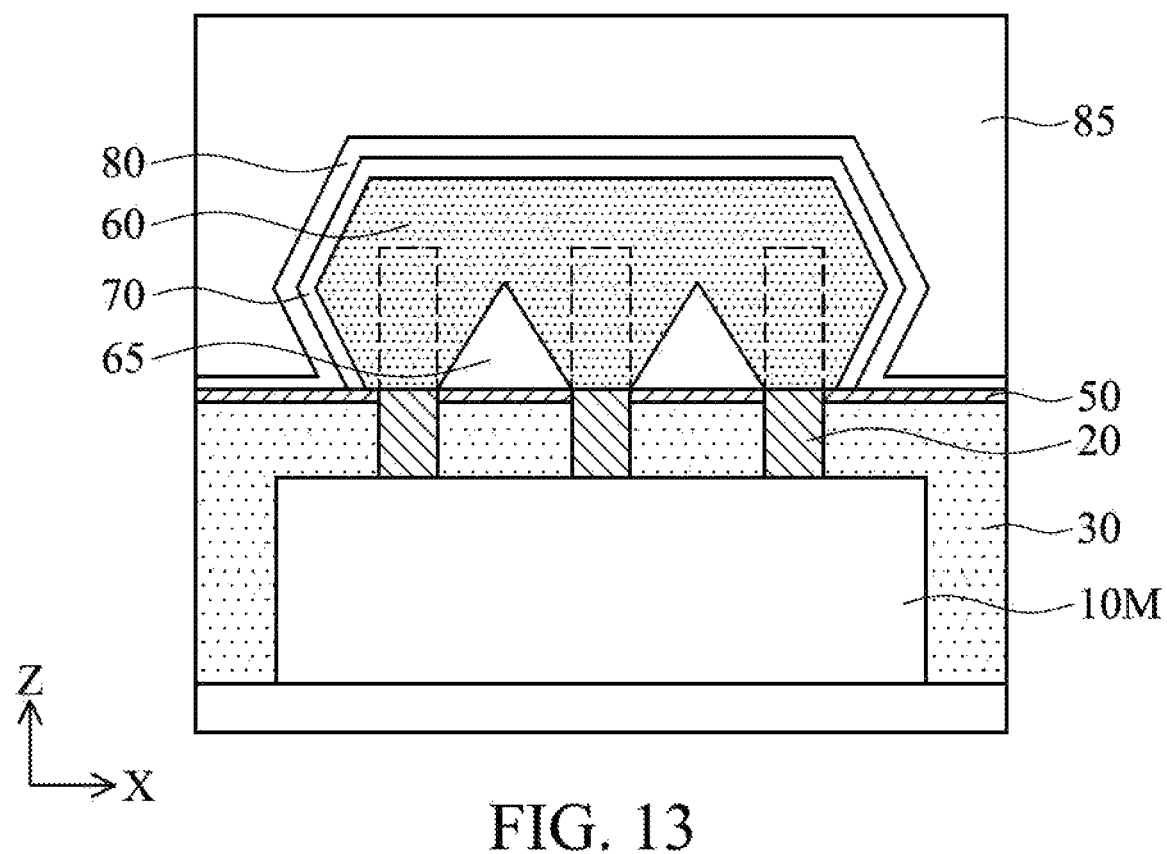
FIG. 13 shows one of the various stages of a sequential manufacturing operation of a semiconductor device according to an embodiment of the disclosure.

Then, as shown in FIG. 13, an insulating layer 80, functioning as a contact etching stop layer, is formed over the formed metal gate structure and the source/drain structures 60, and then the second interlayer dielectric layer 85 is formed. The insulating layer 80 is one or more layers of insulating material. In one embodiment, the insulating layer 80 is made of silicon nitride formed by CVD.

Figure 14:
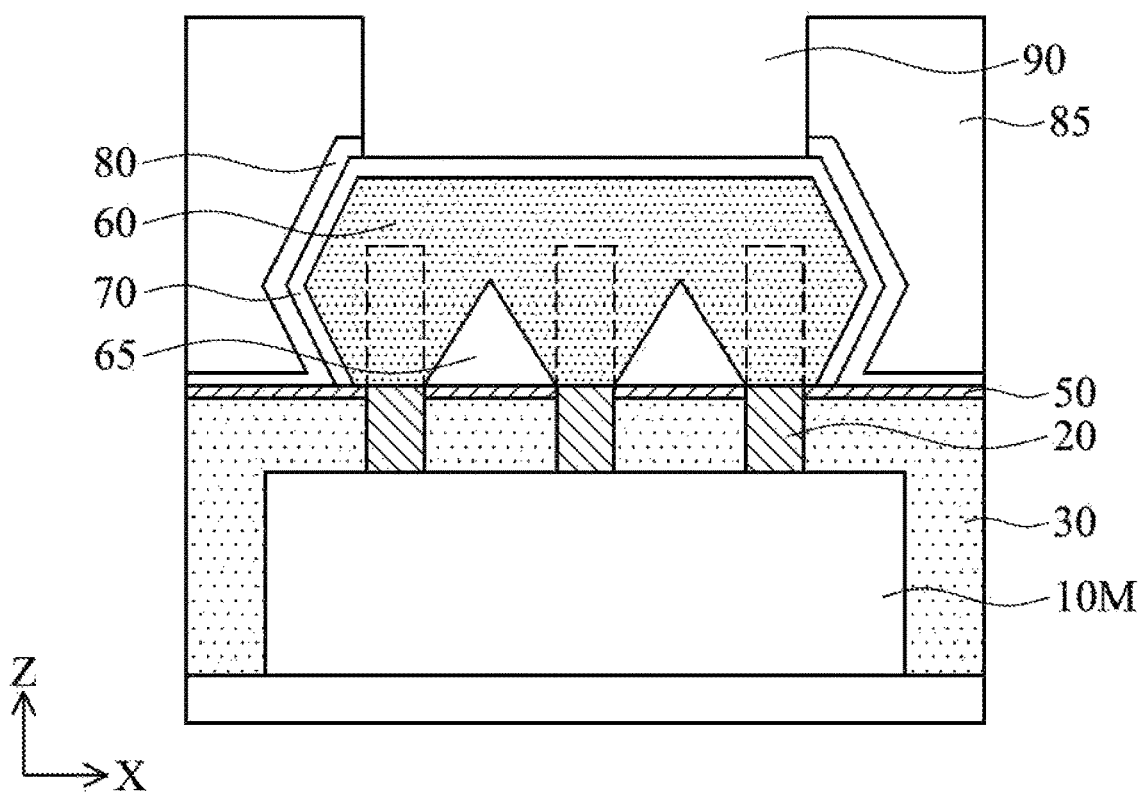
FIG. 14 shows one of the various stages of a sequential manufacturing operation of a semiconductor device according to an embodiment of the disclosure.

By using a patterning operation including lithography, a contact hole 90 is formed in the second interlayer dielectric layer 85 and the insulating layer 80 so as to expose the epitaxial source and drain structures 60 with the silicide layer 70, as shown in FIG. 14.

Figure 15:
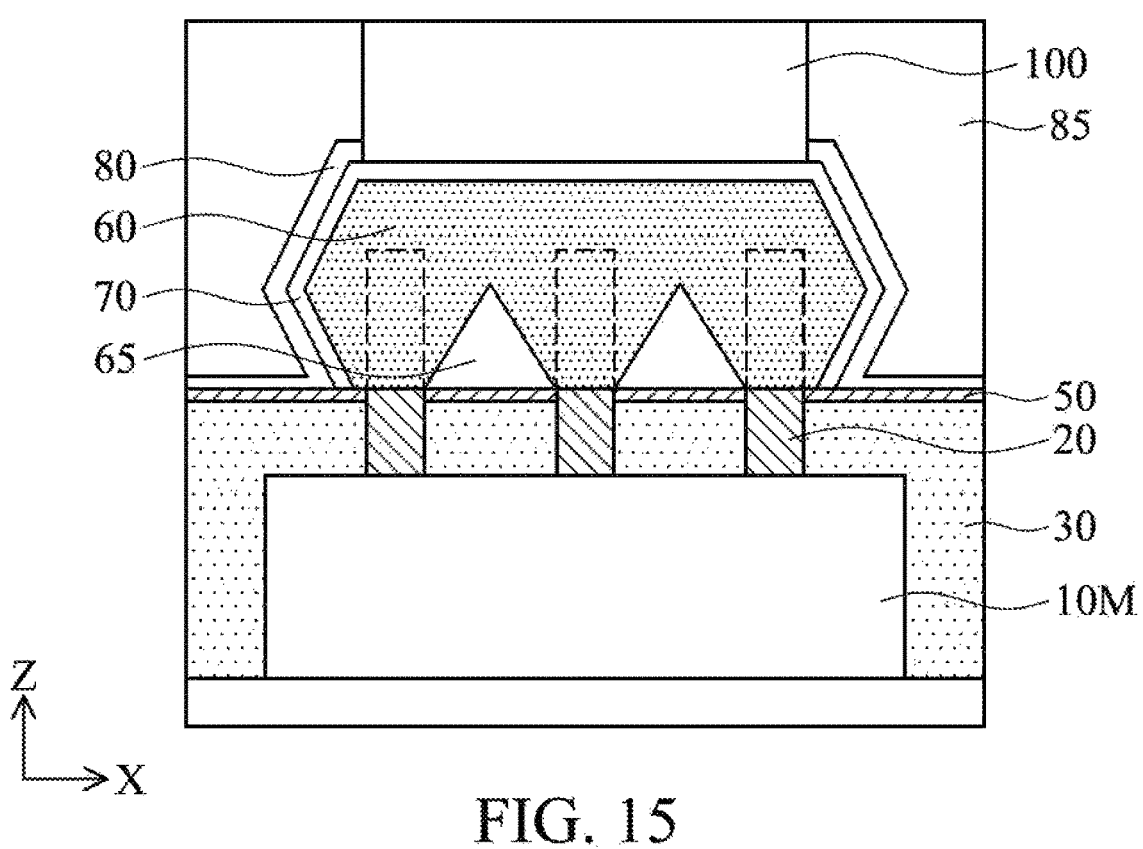
FIG. 15 shows one of the various stages of a sequential manufacturing operation of a semiconductor device according to an embodiment of the disclosure.

Then, the contact hole is filled with a conductive material, thereby forming a contact plug 100, as shown in FIG. 15. The contact plug 100 may include a single layer or multiple layers of any suitable metal such as Co, W, Ti, Ta, Cu, Al and/or Ni and/or nitride thereof.

After forming the contact plug, further CMOS processes are performed to form various features such as additional interlayer dielectric layer, contacts/vias, interconnect metal layers, and passivation layers, etc.

Figure 16:
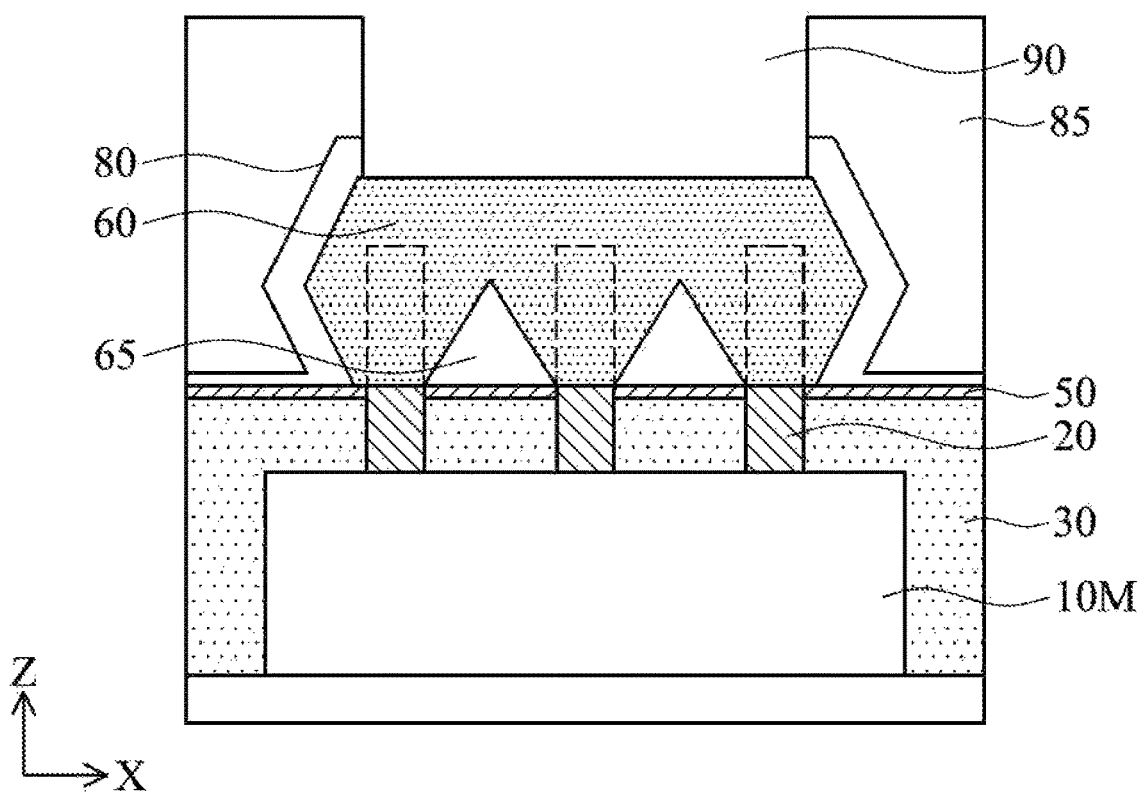
FIG. 16 shows one of the various stages of a sequential manufacturing operation of a semiconductor device according to an embodiment of the disclosure.
Figure 17:
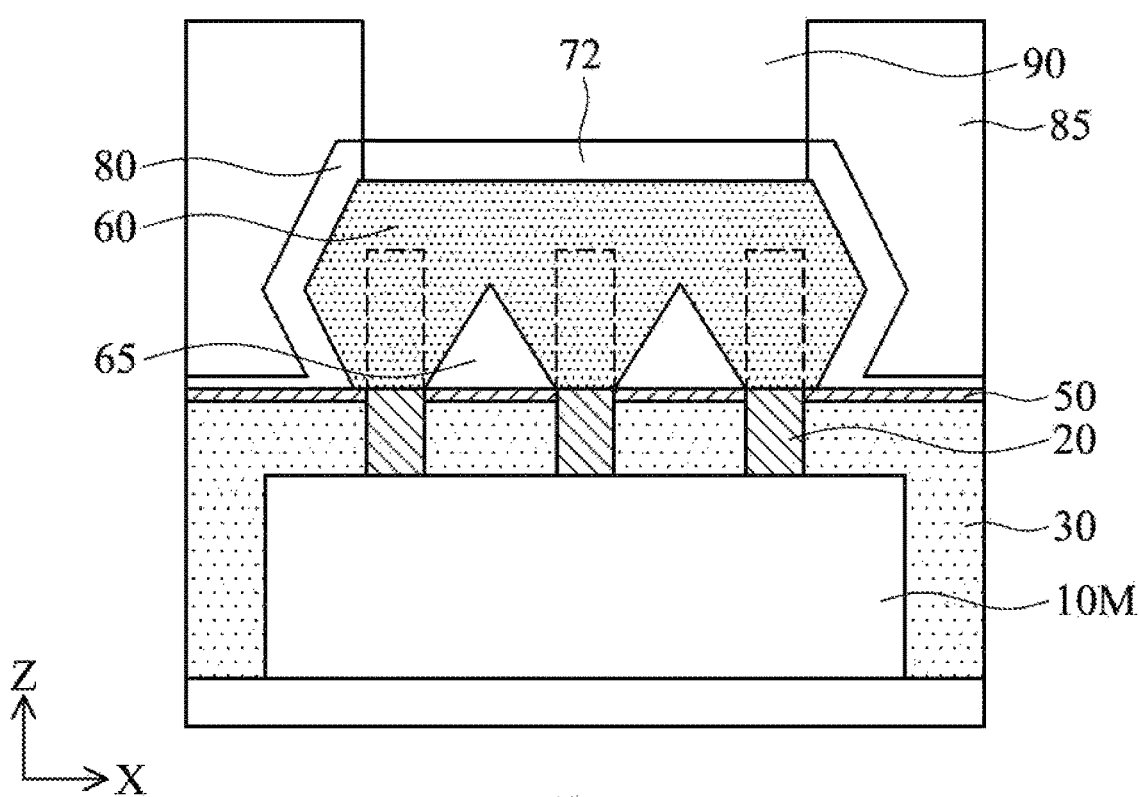
FIG. 17 shows one of the various stages of a sequential manufacturing operation of a semiconductor device according to an embodiment of the disclosure.
Figure 18:
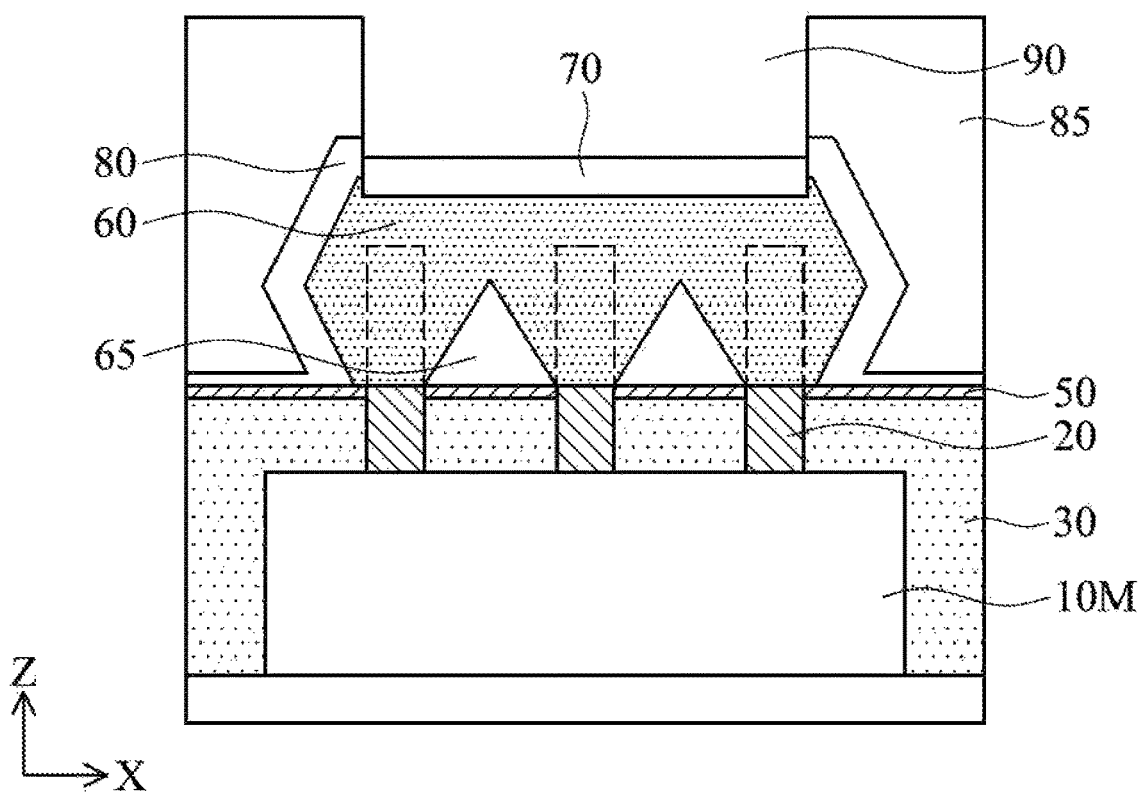
FIG. 18 shows one of the various stages of a sequential manufacturing operation of a semiconductor device according to an embodiment of the disclosure.
Figure 19:
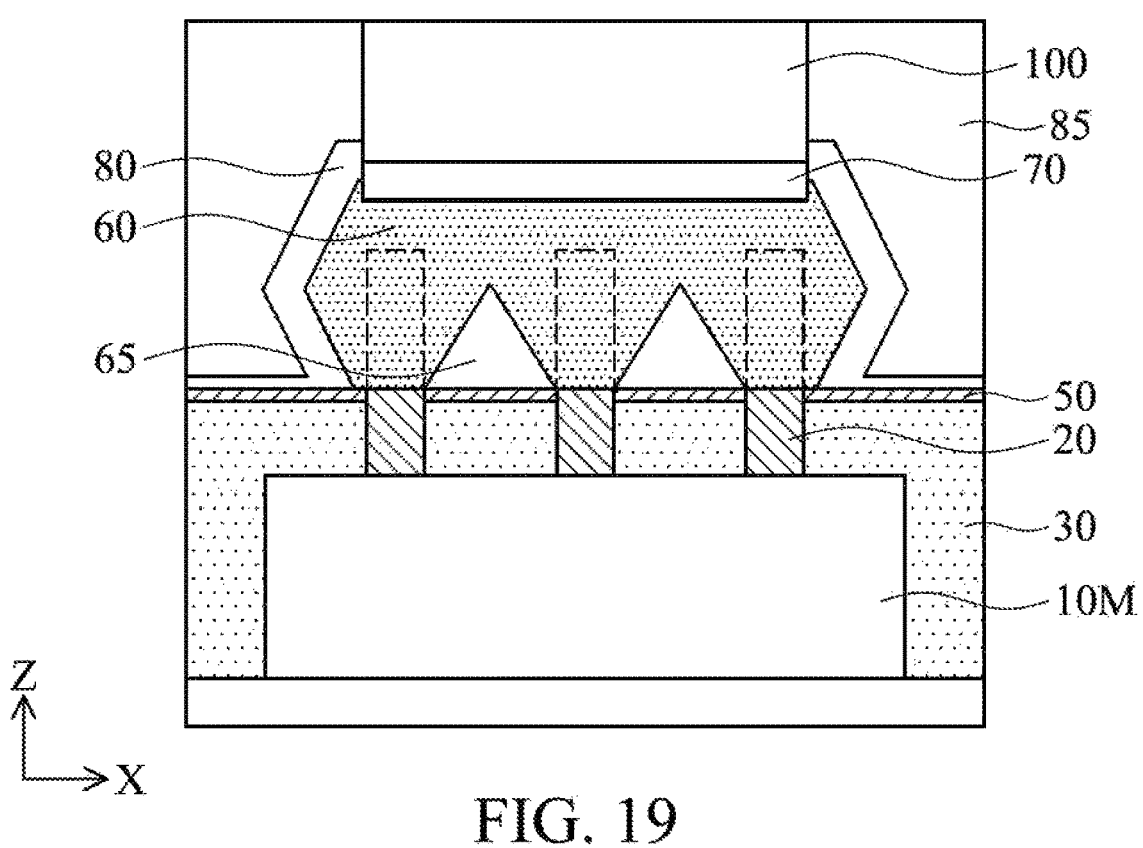
FIG. 19 shows one of the various stages of a sequential manufacturing operation of a semiconductor device according to an embodiment of the disclosure.

In the alternative, the metal-semiconductor compound layer 70 is formed after the contact hole 90 is opened. In such a case, after forming the epitaxial source/drain structure 60 as shown in FIG. 8, the metal gate structures, the insulating layer 80 (contact etching stop layer) and the interlayer dielectric layer 85 are formed, without forming a metal-semiconductor compound layer. Then, a contact hole 90 is formed in the insulating layer 80 and the interlayer dielectric layer 85 to expose the upper surface of the epitaxial source/drain structure 60, as shown in FIG. 16. Then a metal layer 72 is formed on the upper surface of the epitaxial source/drain structure 60, as shown in FIG. 17. The metal layer 72 can be formed by any suitable metal deposition technique, including CVD and PVD. After forming the metal layer 72, the structure of FIG. 17 is annealed to react the metal layer 72 with the epitaxial source/drain structure 60 to form the metal-semiconductor compound layer 70, as shown in FIG. 18, in a similar manner as disclosed herein in reference to FIGS. 10A-10E. As previously explained with reference to FIGS. 10A-10E, the portion of the epitaxial source/drain structure 60 that reacts with the metal layer 72 to form the metal-semiconductor compound layer 70 includes a portion of the third epitaxial layer 60c, a portion of the fourth epitaxial layer 60d, or the fourth epitaxial layer 60d and a portion of the third epitaxial layer 60c in various embodiments. After forming the metal-semiconductor compound layer 70, the conductive material 100 is formed in the contact hole, thereby forming a contact plug, as shown in FIG. 19.

Figure 20:
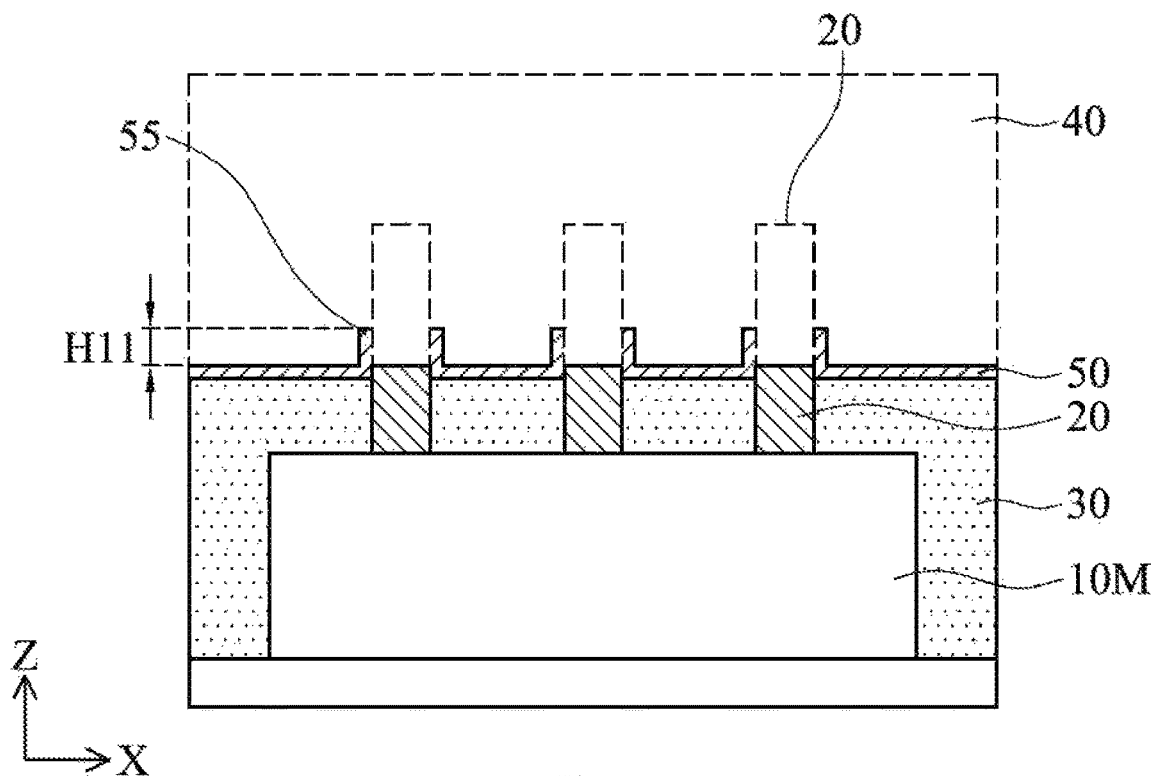
FIG. 20 shows one of the various stages of a sequential manufacturing operation of a semiconductor device according to an embodiment of the disclosure.
Figure 21:
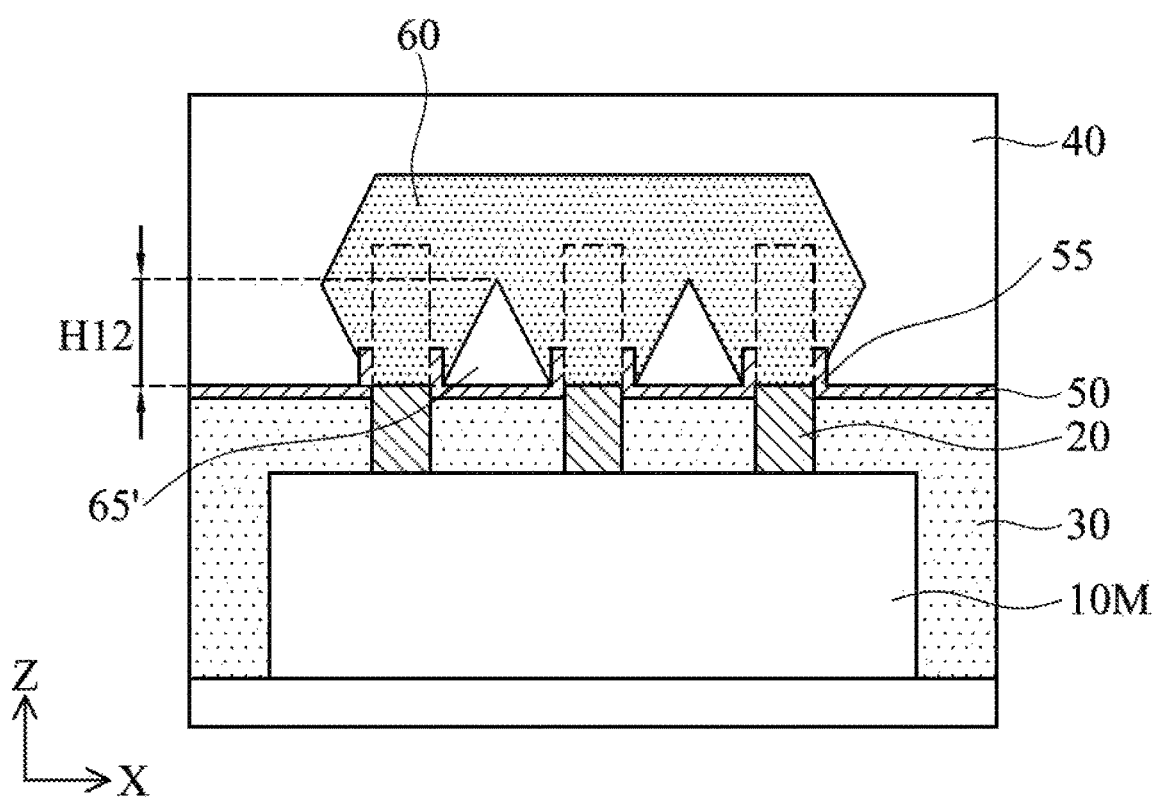
FIG. 21 shows one of the various stages of a sequential manufacturing operation of a semiconductor device according to an embodiment of the disclosure.

FIGS. 20 and 21 show exemplary cross sectional views of various stages for manufacturing a semiconductor device according to another embodiment of the present disclosure.

During the recess etching of the fin mask layer 50 and the fin structures 20 described with respect to FIG. 7, some lower portions of the fin mask layer 50 disposed on sidewall of the fin structures 20 remain without being etched away thereby forming sleeve-like portions 55, as shown in FIG. 20. The height H11 of the sleeve-like portions 55 is in a range from about 1 nm to about 10 nm in some embodiments.

Then, similar to FIG. 8, the epitaxial source/drain structure 60 is formed, thereby forming voids 65', as shown in FIG. 21. Due to the sleeve-like portions 55, the height H12 of the voids 65' in this embodiment is greater than the height H3 in FIG. 8. The height H12 is in a range from about 20 nm to about 35 nm in some embodiments.

Figure 22:
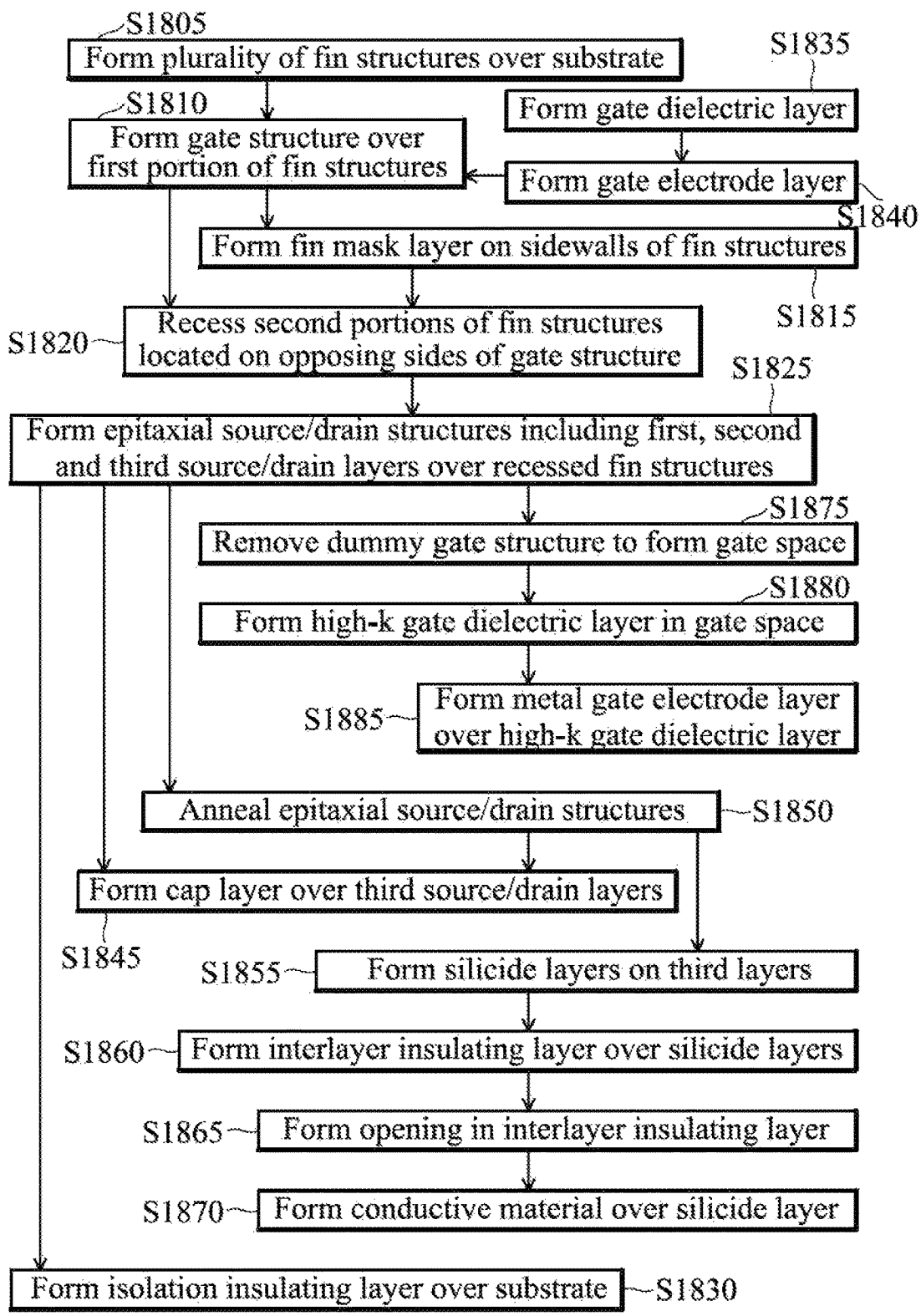
FIG. 22 shows a process flow of a manufacturing operation of a semiconductor device according to embodiments of the disclosure.

A process flow of a method 1800 of manufacturing a semiconductor device according to some embodiments of the disclosure is illustrated in FIG. 22. The method includes an operation S1805 of forming a plurality of fin structures 20 over a substrate 10, wherein the fin structures 20 extend in a first direction (y-direction) (see FIG. 2). In operation S1810, a gate (or dummy gate) structure 40 is formed over a first portion of the fin structures 20, wherein the gate structure extends in a second direction crossing the first direction (x-direction) (see FIGS. 5A and 5B). In some embodiments, a fin mask layer 50 is subsequently formed on sidewalls of the fin structures 20 in operation S1815 (see FIG. 6).

In operation S1820, second portions of the fin structures 20 are recessed, wherein the second portions are located on opposing sides of the gate structure 40 (see FIG. 7). Epitaxial source/drain structures 60 are formed over the recessed fin structures 20 in operation S1825 (see FIG. 8). The epitaxial source/drain structures include a first layer 60*a* having a first concentration of a dopant, a second layer 60*b* having a second concentration of the dopant, and a third layer 60*c* having a third concentration of the dopant (see FIGS. 9A-9H). The second or third layers 60*b*, 60*c* of adjacent epitaxial source/drain structures 60 formed over the fin structures 20 merge to form a merged source/drain structure.

In some embodiments, an isolation insulating layer 30 is formed over the substrate 10 in operation S1830 so that lower portions of the fin structures 20 are embedded in the isolation insulating layer 30 and upper portions of the fin structures 20 are exposed from the isolation insulating layer 30 (see FIG. 4).

In some embodiments, the forming a gate structure includes forming a gate dielectric layer 42 over the first portions of the fin structures 20 in operation S1835 and forming a gate electrode layer 44 over the gate dielectric layer 42 in operation S1840. In some embodiments, the method 1800 includes forming a cap layer 60*d* over the third layer 60*c* in operation S1845 (see FIGS. 9J and 9K). In some embodiments, the method includes annealing the epitaxial source/drain structures 60 in operation S1850. In some embodiments, the method includes after the third layer 60*c* is formed: annealing the epitaxial source/drain structures in operation S1850, forming silicide layers 70 on the third layers 60*c* in operation S1855, forming an interlayer insulating layer 85 over the silicide layers 70 in operation S1860, forming an opening 90 in the interlayer insulating layer 85 in operation S1865, and forming a conductive material 100 over the silicide layers 70 in the opening in operation S1870 (see FIGS. 13-15).

In some embodiments, the gate electrode structure 40 is a sacrificial gate structure, and the method includes after the operation S1825 of forming the epitaxial source/drain structures: removing the sacrificial gate structure 40 to form a gate space 110 in operation S1875, forming a high-k gate dielectric layer 115 in the gate space in operation S1880, and forming a metal gate electrode layer 120 over the high-k gate dielectric layer 115 in operation S1885.

Figure 23:
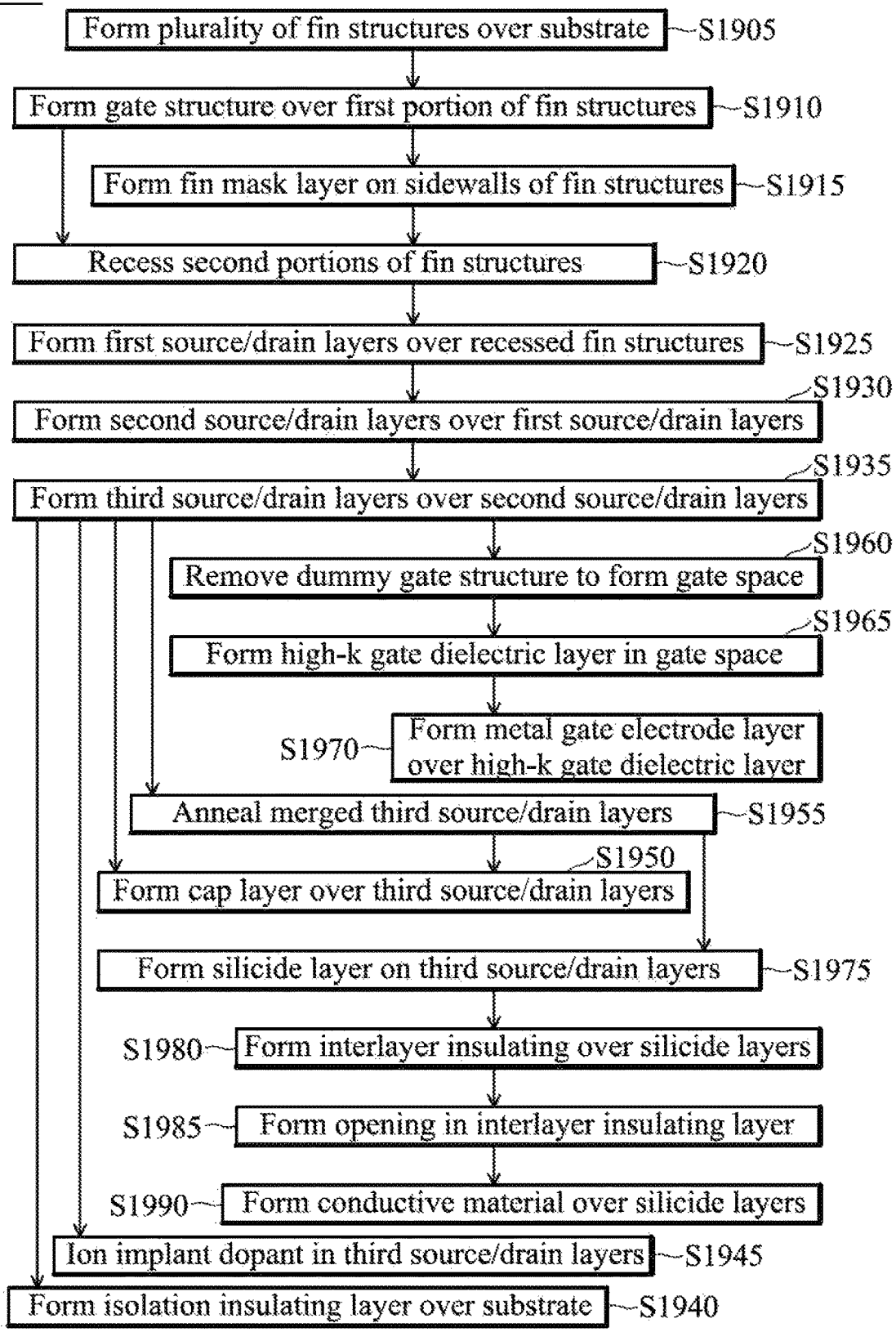
FIG. 23 shows a process flow of a manufacturing operation of a semiconductor device according to embodiments of the disclosure.

A process flow of another method 1900 of manufacturing a semiconductor device according to some embodiments of the disclosure is illustrated in FIG. 23. The method includes an operation S1905 of forming a plurality of fin structures 20 over a substrate 10, wherein the fin structures extend in a first direction. In operation S1910, a gate structure 40 is formed over a first portion of the fin structures 20, wherein the gate structure extends in a second direction crossing the first direction. In some embodiments, a fin mask layer 50 is formed on sidewalls of the fin structures 20 in operation S1915. In operation S1920, second portions of the fin structures 20 are recessed, wherein the second portions are located on opposing sides of the gate structure 40.

In operation S1925, first source/drain layers 60*a* are subsequently formed over each of the recessed fin structures 20. Then, second source/drain layers 60*b* are formed over each of the first source/drain layers 60*a* in operation S1930. Next, third source/drain layers 60*c* are formed over the second source/drain layers 60*b* in operation S1935.

In some embodiments, the method 1900 includes forming an isolation insulating layer 30 over the substrate 10 in operation S1940.

In some embodiments, an ion implantation operation to increase the dopant concentration in the third source/drain layers 60*c* is performed in operation S1945.

In some embodiments, the method includes an operation S1950 of forming cap layers 60*d* including a dopant over the third source/drain layers 60*c*. In some embodiments, the method includes an operation S1955 of annealing the third source/drain layers 60*c*.

In some embodiments, the gate electrode structure is a sacrificial gate structure, and the method includes an operation S1960 of removing the sacrificial gate structure to form a gate space 110 after forming the source/drain layers 60. A high-k gate dielectric layer 115 is formed in the gate space 110 in some embodiments in operation S1965, and then a metal gate electrode layer 120 is formed over the high-k gate dielectric layer 115 in operation S1970.

In some embodiments, after the third source/drain layers 60*c* are formed, the method includes the operation S1955 of annealing the merged third source/drain layers 60*c*, followed by an operation S1975 of forming a silicide layer 70 on the merged third source/drain layers 60*c*, an operation S1980 of forming an interlayer insulating layer 85 over the silicide layer 70, an operation S1985 of forming an opening 90 in the interlayer insulating layer 85, and an operation S1990 of forming a conductive material 100 over the silicide layer 70 in the opening 90.

Figure 24:
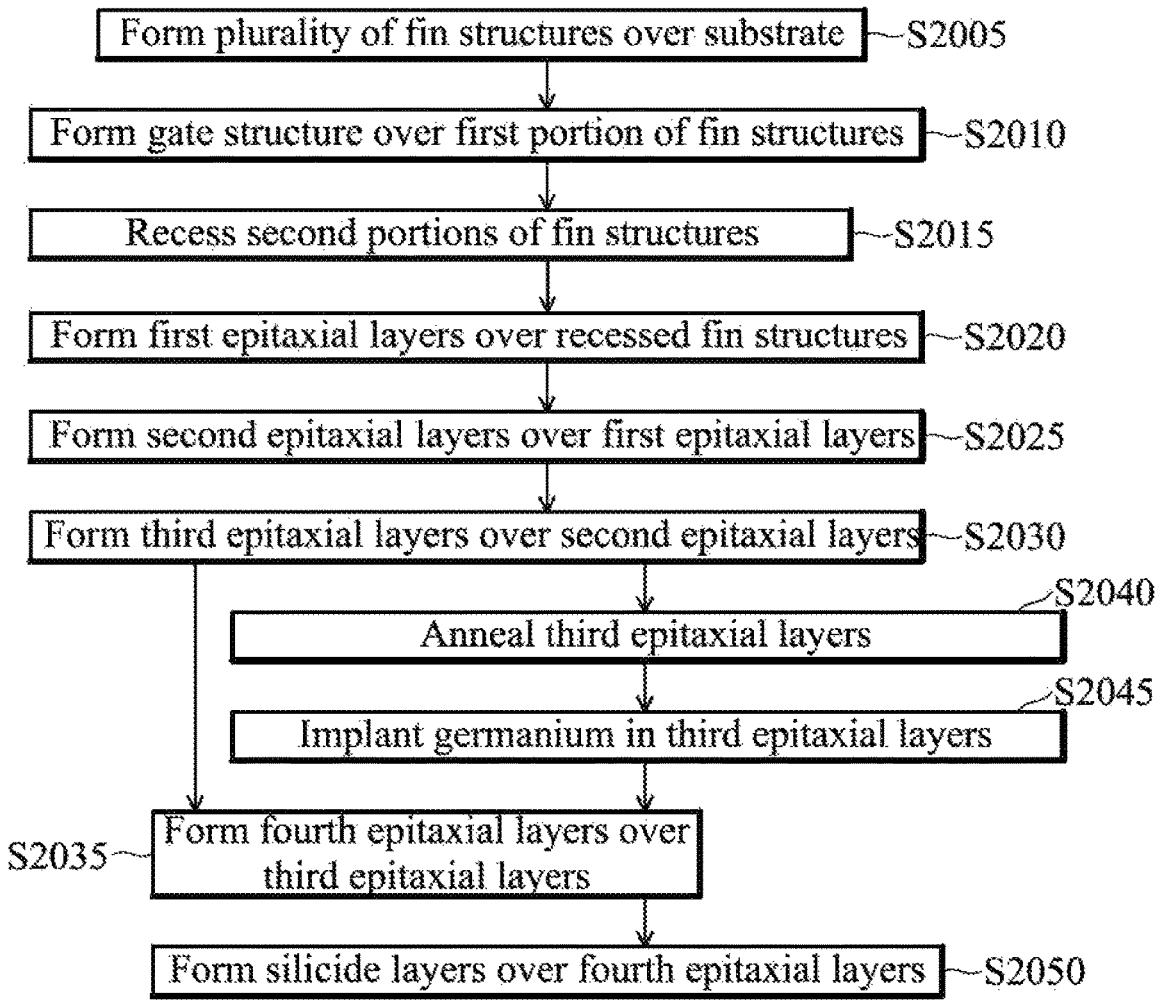
FIG. 24 shows a process flow of a manufacturing operation of a semiconductor device according to embodiments of the disclosure.

A process flow of another method 2000 of manufacturing a semiconductor device according to some embodiments of the disclosure is illustrated in FIG. 24. The method includes an operation S2005 of forming a plurality of fin structures 20 over a substrate 10. In operation S2010, a gate structure 40 is formed over a first portion of the fin structures 20. Then, in operation S2015, second portions of the fin structures 20 are recessed, wherein the second portions are located on opposing sides of the gate structure 40.

First epitaxial layers 60*a* are subsequently formed over each of the recessed fin structures 20 in operation S2020, second epitaxial layers 60*b* are formed over each of the first epitaxial layers 60*a* in operation S2025, and third epitaxial layers 60*c* are formed over the second epitaxial layers 60*b* in operation S2030. Fourth epitaxial layers 60*d* are formed over the third epitaxial layers 60*c* in operation S2035.

In operation S2040, the method includes performing an annealing operation on the third epitaxial layers 60*c*. In some embodiments, the fourth epitaxial layers 60*d* are formed after the annealing operation S2040. In some embodiments, germanium is implanted into the third epitaxial layers 60*c* in operation S2045 after the annealing operation S2040. In some embodiments, the method includes an operation S2050 of forming a silicide layer 70 over the fourth epitaxial layers 60*d*.

Figure 25A:
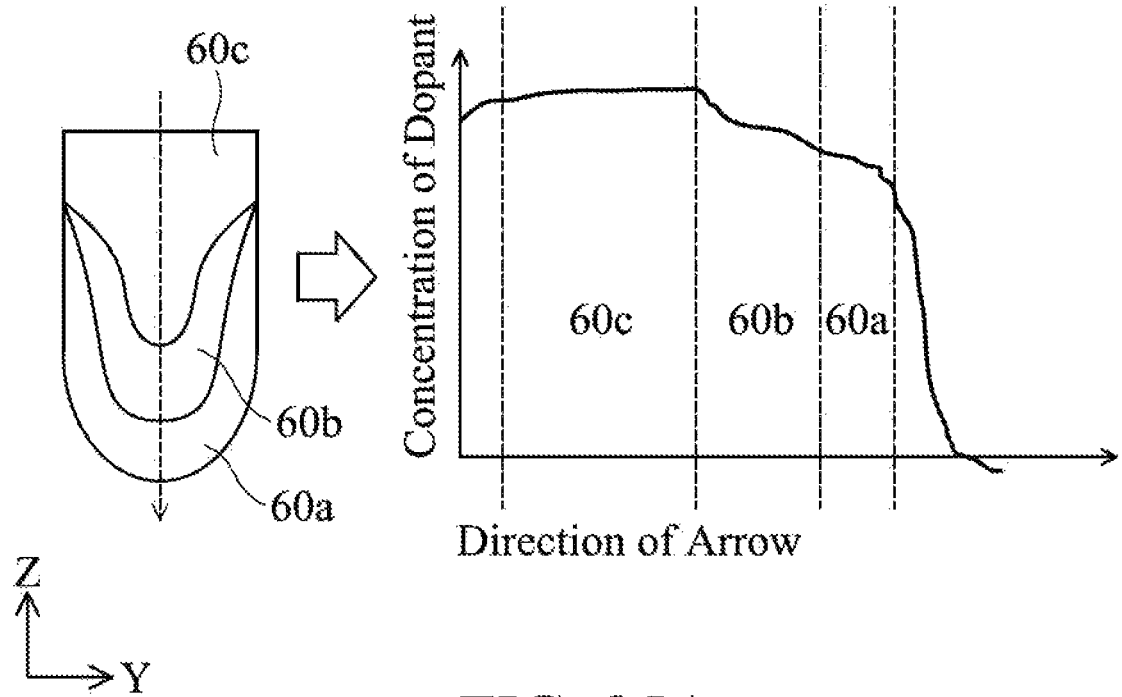
FIGS. 25A and 25B show a dopant distribution in a source/drain structure according to embodiments of the disclosure.
Figure 25B:
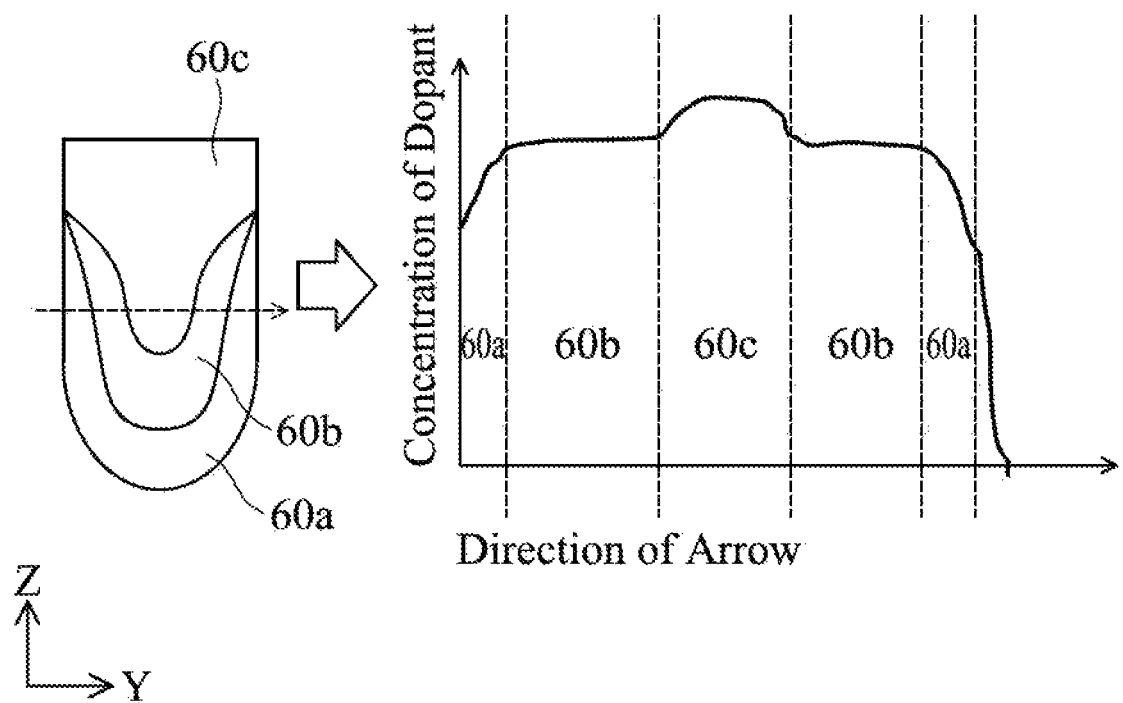

FIGS. 25A and 25B show a dopant distribution in a source/drain epitaxial structure 60 according to embodiments of the disclosure. As shown in FIG. 25A, proceeding from the top of the third epitaxial layer 60*c* down towards the fin structure, the concentration of the dopant is highest in the third epitaxial layer 60*c* and then decreases in the second epitaxial layer 60*b* and the first epitaxial layer 60*a*. In some embodiments, the concentration of the dopant is substantially constant within each of the first epitaxial layer 60*a*, second epitaxial layer 60*b*, and third epitaxial layer 60*c*. In some embodiments, the concentration of the dopant varies by less than 20% across the thickness of each of the first epitaxial layer 60*a*, second epitaxial layer 60*b*, or third epitaxial layer 60*c*, while in other embodiments; the concentration of the dopant varies by less than 10% across the thickness of each layer.

In FIG. 25B, the arrow proceeds in a horizontal direction at about the center of the source/drain epitaxial structure 60. The concentration of the dopant increases from the first epitaxial layer 60a to the second epitaxial layer 60b, and increases again in the third epitaxial layer 60c, where the concentration of the dopant is the highest. Then the concentration of the dopant decreases in the second epitaxial layer 60b, and the dopant concentration decreases again in the first epitaxial layer 60a. In some embodiments, the concentration of the dopant is substantially constant within each of the first epitaxial layer 60a, second epitaxial layer 60b, and third epitaxial layer 60c. In some embodiments, the concentration of the dopant varies by less than 20% across the width of each of the first epitaxial layer 60a, second epitaxial layer 60b, or third epitaxial layer 60c, while in other embodiments; the concentration of the dopant varies by less than 10% across the width of each layer.

Additional processing operations are performed in some embodiments to manufacture semiconductor devices. Other embodiments include other operations before, during, or after the operations described above. In some embodiments, the method includes forming fin field effect transistor (FinFET) structures. In some embodiments, the method includes other operations to form a plurality of gate electrodes on the semiconductor substrate. In another embodiment, a target pattern is to be formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the methods described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed.

Embodiments of the present disclosure provide semiconductor devices having source/drains having improved electrical parameters, including reduced resistance. Semiconductor devices according to the present disclosure have source/drains wherein an increased volume of the source/drain structure has a high concentration of dopant. The reduced resistance is provided by the large volume of the source/drain that includes the high concentration of dopant. Semiconductor devices according to embodiments of the disclosure have increased surface area where metal contacts contact high dopant concentration (i.e. —low resistance portions of the source/drain structures). Thus, resistance is lowered. In some embodiments, the high dopant concentration portion of the source/drain structure extends deeper into the source/drain structure.

In some embodiments, semiconductor devices having about a 4% to about 5% increase in DC $Id_{eff}$ are provided. In some embodiments according to the present disclosure, the channel resistance $R_c$ is reduced by about 0.15 kohms. In some embodiments according to the present disclosure, resistance $R_p$, where $R_p=R_{plug}+R_{CSD}+R_{SD}+R_{LDD}+R_{ov}$ is reduced by about 0.2 kohms to 0.7 kohms. $R_{plug}$ is the resistance of the contact plug. $R_{CSD}$ is the resistance between the source/drain and the contact plug. $R_{SD}$ is the resistance of the source/drain. $R_{LDD}$ is the resistance of the lightly doped drain region. $R_{ov}$ is the resistance of overlay due to the overlay between the lightly doped drain region, channel, and gate. In some embodiments, $R_{sd}$ and $R_{csd}$ are reduced by the increased dopant concentration. In some embodiments according to the present disclosure, drain induced barrier lowering (DIBL) is about 0 mV. In some embodiments according to the present disclosure, the $C_{eff}$ is increased about 1%.

It will be understood that not all advantages have been necessarily discussed herein, no particular advantage is required for all embodiments or examples, and other embodiments or examples may offer different advantages.

An embodiment of the disclosure is a method of manufacturing a semiconductor device, including forming a plurality of fin structures over a substrate, wherein the fin structures extend in a first direction. A gate structure is formed over a first portion of the fin structures, wherein the gate structure extends in a second direction crossing the first direction. Second portions of the fin structures are recessed to form recessed portions of the fin structures, wherein the second portions are located on opposing sides of the gate structure. Epitaxial source/drain structures are formed over the recessed portions of the fin structures. The epitaxial source/drain structures include a first layer having a first concentration of a dopant, a second layer having a second concentration of the dopant, and a third layer having a third concentration of the dopant. The third concentration is greater than the second concentration, and the second concentration is greater than the first concentration. At least the third layers of adjacent epitaxial source/drain structures formed over the fin structures are merged thereby forming a merged source/drain structure, and a height in a third direction substantially perpendicular to the first and second directions from a level of upper surfaces of adjacent fin structures to an uppermost point of a lower surface of the merged source/drain structure is greater than a thickness of the merged source/drain structure in the third direction from the uppermost point of the lower surface of merged source/drain structure to a top surface of the merged source/drain structure. In an embodiment, the method includes forming an isolation insulating layer over the substrate so that lower portions of the fin structures are embedded in the isolation insulating layer and upper portions of the fin structures are exposed from the isolation insulating layer. In an embodiment, during the recessing second portions of the fin structures, the fin structures are recessed below an upper surface of the isolation insulating layer. In an embodiment, a fin mask layer is formed on sidewalls of the fin structures and on an upper surface of the isolation insulating layer. In an embodiment, the method includes forming a cap layer over the epitaxial source/drain structures, wherein the cap layer has a fourth concentration of a dopant and the fourth concentration is less than the third concentration. In an embodiment, the method includes, after the cap layer is formed, annealing the epitaxial source/drain structures, and forming a metal-semiconductor compound layer on the epitaxial source/drain structures. In an embodiment, the method includes, after the cap layer is formed, annealing the epitaxial source/drain structures, forming an interlayer insulating layer over the epitaxial source/drain structures, forming an opening in the interlayer insulating layer, and forming a conductive material in the opening. In an embodiment, the method includes forming a metal-semiconductor compound layer on the epitaxial source/drain structures in the opening before forming the conductive material. In an embodiment, the method includes annealing the epitaxial source/drain structures.

Another embodiment of the disclosure is a method of manufacturing a semiconductor device, including forming a plurality of fin structures over a substrate, wherein the fin structures extend in a first direction. A gate structure is formed over a first portion of the fin structures, wherein the gate structure extends in a second direction crossing the first direction. Second portions of the fin structures are recessed to form recessed portions of the fin structures, wherein the second portions are located on opposing sides of the gate structure. First source/drain layers are formed over each of the recessed portions of the fin structures. Second source/drain layers are formed over each of the first source/drain layers. The first and second source/drain layers are U-shaped as viewed in cross section. Third source/drain layers are formed over the second source/drain layers. The third source/drain layers extend into the second source/drain layers to a depth from an uppermost surface of the second source/drain layers greater than half a height of the second source/drain layers as viewed in cross section. A concentration of dopant in the third source/drain layers is greater than a concentration of the dopant in the second source/drain layers, and the concentration of the dopant in the second source/drain layers is greater than a concentration of the dopant in the first source/drain layers. In an embodiment, the method includes forming an isolation insulating layer over the substrate so that lower portions of the fin structures are embedded in the isolation insulating layer and upper portions of the fin structures are exposed from the isolation insulating layer. In an embodiment, during the recessing second portions of the fin structures, the fin structures are recessed below an upper surface of the isolation insulating layer. In an embodiment, the first, second, and third source/drain layers are formed using a silicon source material and an As, P, or Sb source material. In an embodiment, the method includes an ion implantation operation to increase the dopant concentration in the third source/drain layers. In an embodiment, the method includes forming cap layers including a dopant, wherein a concentration of the dopant in the cap layers is less than the concentration of the dopant in the third source/drain layers, and wherein the dopant is same or different than the dopant in the third source/drain layers. In an embodiment, the method includes forming a fin mask layer on sidewalls of the fin structures. In an embodiment, the third source/drain layers on adjacent fin structures merge with each other. In an embodiment, the method includes, after the third source/drain layers are formed: annealing the merged third source/drain layers, and forming a metal-semiconductor compound layer on the merged third source/drain layers. In an embodiment, the method includes annealing the merged third source/drain layers, forming an interlayer insulating layer over the merged third source/drain layers, forming an opening in the interlayer insulating layer over each of the merged third source/drain layers, and forming a conductive material over the merged third source/drain layers in each of the openings.

Another embodiment of the disclosure is a semiconductor device, including a plurality of fin structures extending in a first direction over a substrate, and a gate structure extending in a second direction crossing the first direction disposed over a first portion of the fin structures. Epitaxial source/drain structures are disposed over second portions of the fin structures. Second portions of the fin structures are located on opposing sides of the gate structure. Each of the epitaxial source/drain structures include a first layer having a first concentration of a dopant, a second layer having a second concentration of the dopant disposed over the first layer, and a third layer having a third concentration of the dopant disposed over the second layer. The third concentration is greater than the second concentration, and the second concentration is greater than the first concentration. The source/drain structure is a merged source/drain structure, wherein at least the third layers of adjacent epitaxial source/drain structures are merged, and a height in a third direction substantially perpendicular to the first and second directions from a level of upper surfaces of the second portions of the fin structures of adjacent fin structures to an uppermost point of a lower surface of the merged adjacent epitaxial source/drain structure is greater than a thickness of the merged adjacent epitaxial source/drain structure in the third direction from the uppermost point of the lower surface of the merged adjacent epitaxial source/drain structure to a top surface of the merged adjacent epitaxial source/drain structure. In an embodiment, the third concentration of the dopant ranges from $1\times10^{21}$ atoms/cm$^3$ to $5\times10^{21}$ atoms/cm$^3$. In an embodiment, the third concentration of the dopant ranges from $3\times10^{21}$ atoms/cm$^3$ to $4.5\times10^{21}$ atoms/cm$^3$. In an embodiment, the second concentration of the dopant ranges from $9.0\times10^{20}$ atoms/cm$^3$ to $2\times10^{21}$ atoms/cm$^3$. In an embodiment, a ratio of the height in the third direction to the thickness of the merged adjacent epitaxial source/drain structure ranges from 1.05 to 3.0. In an embodiment, a ratio of the height in the third direction to the thickness of the merged adjacent epitaxial source/drain structure ranges from 1.2 to 2.0. In an embodiment, the height in the third direction ranges from 20.1 nm to 75 nm, and the thickness of the merged adjacent epitaxial source/drain structures ranges from 20 nm to 25 nm. In an embodiment, the dopant is at least one selected from the group consisting of As, P, and Sb. In an embodiment, the semiconductor device includes cap layers including a dopant disposed over the epitaxial source/drain structures, wherein the concentration of the dopant is less than the dopant concentration in the third layer. In an embodiment, the cap layers include silicon and germanium.

Another embodiment of the disclosure is a method of manufacturing a semiconductor device, including forming a plurality of fin structures over a substrate, wherein the fin structures extend in a first direction. A gate structure is formed over a first portion of the fin structures, wherein the gate structure extends in a second direction crossing the first direction. Second portions of the fin structures are recessed to form recessed fin structures, wherein the second portions are located on opposing sides of the gate structure. First epitaxial layers are formed over each of the recessed fin structures, and second epitaxial layers are formed over each of the first epitaxial layers. The first and second epitaxial layers are U-shaped as viewed in cross section. Third epitaxial layers are formed over the second epitaxial layers. The third epitaxial layers extend into the second epitaxial layers, as viewed in cross section. A concentration of dopant in the third epitaxial layers is greater than a concentration of the dopant in the second epitaxial layers, and the concentration of the dopant in the second epitaxial layers is greater than a concentration of the dopant in the first epitaxial layers. Fourth epitaxial layers are formed over the third epitaxial layers, wherein the fourth epitaxial layers have a concentration of a dopant less than the concentration of the dopant in the third epitaxial layers, and wherein the dopant in the fourth epitaxial layers is same or different than the dopant in the third epitaxial layers. In an embodiment, the first, second, and third source/drain layers are formed using a silicon source material and a dopant source material. In an embodiment, the silicon source is an organosilane. In an embodiment, the dopant source material is selected from phosphine, arsine, an alkylphosphine, and alkylarsine. In an embodiment, the dopant source material includes a phosphorus dimer. In an embodiment, the method includes performing an annealing operation on the third epitaxial layers. In an embodiment, the annealing operation includes millisecond annealing, microsecond single step annealing, laser single step annealing, dynamic surface annealing, or microwave annealing. In an embodiment, the method includes implanting germanium into the third epitaxial layers after the annealing operation. In an embodiment, the method includes forming a metal-semiconductor compound layer over the fourth epitaxial layers. In an embodiment, third epitaxial layers on adjacent fin structures merge with each other.

Another embodiment of the disclosure is a semiconductor device, including a plurality of fin structures extending in a first direction disposed over a substrate. A gate structure extends in a second direction crossing the first direction disposed over a first portion of the fin structures. A fin mask layer is disposed on sidewalls of the fin structures. First source/drain layers disposed over second portions of each of the fin structures. An uppermost surface of the second portions of the fin structures is at a level below an uppermost surface of the first portions of the fin structures as viewed in cross section. Second source/drain layers are disposed over each of the first source/drain layers. The first and second source/drain layers are U-shaped as viewed in cross section, and third source/drain layers are disposed over the second source/drain layers. The third source/drain layers extend into the second source/drain layer to a depth from an uppermost surface of the second source/drain layers greater than half a height of the depth of the second source/drain layers as viewed in cross section. A concentration of dopant in the third source/drain layers is greater than a concentration of the dopant in the second source/drain layers, and the concentration of the dopant in the second source/drain layers is greater than a concentration of the dopant in the first source/drain layers. In an embodiment, the concentration of the dopant in the third source/drain layers ranges from $1\times10^{21}$ atoms/cm$^3$ to $5\times10^{21}$ atoms/cm$^3$. In an embodiment, the concentration of the dopant in the second source/drain layers ranges from $9.0\times10^{20}$ atoms/cm$^3$ to $2\times10^{21}$ atoms/cm$^3$. In an embodiment, the dopant is at least one selected from the group consisting of As, P, and Sb. In an embodiment, the semiconductor device includes cap layers including a dopant disposed over the third source/drain layers, wherein the concentration of the dopant is less than the dopant concentration in the third source/drain layers, and the dopant in the cap layers is same or different than the dopant in the third source/drain layers. In an embodiment, the cap layers comprise silicon and germanium. In an embodiment, the semiconductor device includes silicide layers disposed over the cap layers. In an embodiment, the third source/drain layers disposed over adjacent fin structures are merged. In an embodiment, the third source/drain layers include SiP. In an embodiment, the gate structure includes a high-k gate dielectric layer and a metal gate electrode layer.

Another embodiment of the disclosure is a semiconductor device, including a plurality of fin structures extending in a first direction disposed over a substrate. A gate structure extends in a second direction crossing the first direction disposed over a first portion of the fin structures. First epitaxial layers are disposed over second portions of each of the fin structures. The second portions are located on opposing sides of the gate structure, and an uppermost surface of the second portions is at a level below uppermost surfaces of the first portions as viewed in cross section. Second epitaxial layers are disposed over the first epitaxial layers. The first and second epitaxial layers are U-shaped as viewed in cross section. Third epitaxial layer are disposed over the second epitaxial layers and fill the U-shape of the first and second epitaxial layers. A concentration of dopant in the third epitaxial layers is greater than a concentration of the dopant in the second epitaxial layers, and the concentration of the dopant in the second epitaxial layers is greater than a concentration of the dopant in the first epitaxial layers. Fourth epitaxial layers having a concentration of a dopant less than the concentration of the dopant in the third epitaxial layers are disposed over the third epitaxial layers. The dopant in the fourth epitaxial layers is same as or different than the dopant in the third epitaxial layers. In an embodiment, the concentration of the dopant in the third epitaxial layers ranges from $1\times10^{21}$ atoms/cm$^3$ to $5\times10^{21}$ atoms/cm$^3$. In an embodiment, the concentration of the dopant in the second epitaxial layers ranges from $9.0\times10^{20}$ atoms/cm$^3$ to $2\times10^{21}$ atoms/cm$^3$. In an embodiment, the dopant is at least one selected from the group consisting of As, P, and Sb. In an embodiment, the fourth epitaxial layers include silicon and germanium. In an embodiment, the semiconductor device includes metal-semiconductor compound layers disposed over the fourth epitaxial layers. In an embodiment, the at least the third epitaxial layers disposed over adjacent fin structures are merged. In an embodiment, the thickness of the merged layers ranges from 20 nm to 25 nm. In an embodiment, the third epitaxial layers include SiP. In an embodiment, the gate structure includes a high-k gate dielectric layer and a metal gate electrode layer. The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a plurality of fin structures over a substrate, the fin structures extending in a first direction;
    forming a gate structure over a first portion of the fin structures, the gate structure extending in a second direction crossing the first direction;
    recessing second portions of the fin structures to form recessed portions of the fin structures, wherein the second portions are located on opposing sides of the gate structure; and
    forming epitaxial source/drain structures over the recessed portions of the fin structures,
    wherein the epitaxial source/drain structures include a first layer having a first concentration of a dopant, a second layer having a second concentration of the dopant, and a third layer having a third concentration of the dopant,
    wherein the third concentration is greater than the second concentration, and the second concentration is greater than the first concentration, wherein at least the third layers of adjacent epitaxial source/drain structures formed over the fin structures are merged thereby forming a merged source/drain structure, and wherein a height in a third direction substantially perpendicular to the first and second directions from a level of upper surfaces of adjacent fin structures to an uppermost point of a lower surface of the merged source/drain structure is greater than a thickness of the merged source/drain structure in the third direction from the uppermost point of the lower surface of merged source/drain structure to a top surface of the merged source/drain structure.

2. The method according to claim 1, further comprising forming an isolation insulating layer over the substrate so that lower portions of the fin structures are embedded in the isolation insulating layer and upper portions of the fin structures are exposed from the isolation insulating layer.

3. The method according to claim 2, wherein during the recessing second portions of the fin structures, the fin structures are recessed below an upper surface of the isolation insulating layer.

4. The method according to claim 2, further comprising forming a fin mask layer on sidewalls of the fin structures and on an upper surface of the isolation insulating layer.

5. The method according to claim 1, further comprising forming a cap layer over the epitaxial source/drain structures, wherein the cap layer has a fourth concentration of a dopant and the fourth concentration is less than the third concentration.

6. The method according to claim 5, further comprising, after the cap layer is formed:
annealing the epitaxial source/drain structures; and
forming a metal-semiconductor compound layer on the epitaxial source/drain structures.

7. The method according to claim 5, further comprising, after the cap layer is formed:
annealing the epitaxial source/drain structures;
forming an interlayer insulating layer over the epitaxial source/drain structures;
forming an opening in the interlayer insulating layer; and
forming a conductive material in the opening.

8. The method according to claim 7, further comprising forming a metal-semiconductor compound layer on the epitaxial source/drain structures in the opening before forming the conductive material.

9. The method according to claim 1, further comprising annealing the epitaxial source/drain structures.

10. A method of manufacturing a semiconductor device, comprising:
forming a plurality of fin structures over a substrate, the fin structures extending in a first direction;
forming a gate structure over a first portion of the fin structures, the gate structure extending in a second direction crossing the first direction;
recessing second portions of the fin structures to form recessed portions of the fin structures, wherein the second portions are located on opposing sides of the gate structure;
forming first source/drain layers over each of the recessed portions of the fin structures;
forming second source/drain layers over each of the first source/drain layers,
wherein the first and second source/drain layers are U-shaped as viewed in cross section; and forming third source/drain layers over the second source/drain layers,
wherein the third source/drain layers extend into the second source/drain layers to a depth from an uppermost surface of the second source/drain layers, and the depth is greater than half a height of the second source/drain layer as viewed in cross section, wherein the height of the second source/drain layer is measured from a lowermost surface of the second source/drain layer to the uppermost surface of the second source/drain layer, and wherein a concentration of dopant in the third source/drain layers is greater than a concentration of the dopant in the second source/drain layer, and the concentration of the dopant in the second source/drain layers is greater than a concentration of the dopant in the first source/drain layers.

11. The method according to claim 10, further comprising an ion implantation operation to increase the dopant concentration in the third source/drain layers.

12. The method according to claim 10, further comprising forming a cap layer including a dopant, wherein a concentration of the dopant in the cap layer is less than the concentration of the dopant in the third source/drain layers, and wherein the dopant is same or different than the dopant in the third source/drain layers.

13. The method according to claim 10, wherein third source/drain layers on adjacent fin structures merge with each other.

14. The method according to claim 13, further comprising, after the third source/drain layers are formed:
annealing the merged third source/drain layers; and
forming a metal-semiconductor compound layer on the merged third source/drain layers.

15. The method according to claim 13, further comprising:
annealing the merged third source/drain layers;
forming an interlayer insulating layer over the merged third source/drain layers;
forming an opening in the interlayer insulating layer over each of the merged third source/drain layers; and
forming a conductive material over the merged third source/drain layers in each of the openings.

16. A method of manufacturing a semiconductor device, comprising:
forming a plurality of fin structures over a substrate, wherein the fin structures extend in a first direction;
forming a gate structure over a first portion of the fin structures, wherein the gate structure extends in a second direction crossing the first direction;
recessing second portions of the fin structures to form recessed fin structures, wherein the second portions are located on opposing sides of the gate structure;
forming first epitaxial layers over each of the recessed fin structures;
forming second epitaxial layers over each of the first epitaxial layers,
wherein the first and second epitaxial layers are U-shaped as viewed in cross section;
forming third epitaxial layers over the second epitaxial layers,
wherein the third epitaxial layers extend into the second epitaxial layers, as viewed in cross section,
a concentration of dopant in the third epitaxial layers is greater than a concentration of the dopant in the second epitaxial layers, and the concentration of the dopant in the second epitaxial layers is greater than a concentration of the dopant in the first epitaxial layers;

performing an annealing operation on the third epitaxial layers;

implanting germanium into the third epitaxial layers after the annealing operation; and forming fourth epitaxial layers over the third epitaxial layers, wherein the fourth epitaxial layers have a concentration of a dopant less than the concentration of the dopant in the third epitaxial layers, and the dopant in the fourth epitaxial layers is same or different than the dopant in the third epitaxial layers.

17. The method according to claim 16, wherein the first, second, and third epitaxial layers are formed using a silicon source material and a dopant source material.

18. The method according to claim 17, wherein the dopant source material includes a phosphorus dimer.

19. The method according to claim 16, wherein the fourth epitaxial layer is a SiP layer including 3 at. % to 4 at. % Ge.

20. The method according to claim 19, wherein the concentration of P in the SiP layer ranges from $9.0 \times 10^{20}$ atoms/cm$^3$ to $3.8 \times 10^{21}$ atoms/cm$^3$.

* * * * *